United States Patent
Lee et al.

(10) Patent No.: US 9,929,102 B1
(45) Date of Patent: Mar. 27, 2018

(54) FAN-OUT SEMICONDUCTOR PACKAGE

(71) Applicant: SAMSUNG ELECTRO-MECHANICS CO., LTD., Suwon-si, Gyeonggi-do (KR)

(72) Inventors: Sang Jin Lee, Suwon-si (KR); Dong Hun Lee, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/453,588

(22) Filed: Mar. 8, 2017

(30) Foreign Application Priority Data

Sep. 29, 2016 (KR) .................. 10-2016-0125322

(51) Int. Cl.
| | |
|---|---|
| *H01L 23/00* | (2006.01) |
| *H01L 23/538* | (2006.01) |
| *H01L 23/31* | (2006.01) |
| *H01L 21/56* | (2006.01) |

(52) U.S. Cl.
CPC ........ *H01L 23/5389* (2013.01); *H01L 21/568* (2013.01); *H01L 23/3128* (2013.01); *H01L 23/5384* (2013.01); *H01L 23/5386* (2013.01); *H01L 24/19* (2013.01); *H01L 24/20* (2013.01); H01L 2224/05124 (2013.01); H01L 2224/211 (2013.01); H01L 2224/215 (2013.01); H01L 2924/0105 (2013.01); H01L 2924/01013 (2013.01); H01L 2924/01022 (2013.01); H01L 2924/01028 (2013.01); H01L 2924/01029 (2013.01); H01L 2924/01047 (2013.01); H01L 2924/01079 (2013.01); H01L 2924/01082 (2013.01); H01L 2924/0665 (2013.01); H01L 2924/07025 (2013.01); H01L 2924/10252 (2013.01); H01L 2924/10253 (2013.01); H01L 2924/10329 (2013.01); H01L 2924/15153 (2013.01); H01L 2924/15311 (2013.01); H01L 2924/3511 (2013.01); H01L 2924/35121 (2013.01)

(58) Field of Classification Search
CPC .................................................. H01L 23/5389
See application file for complete search history.

(56) References Cited

U.S. PATENT DOCUMENTS

| | | | | |
|---|---|---|---|---|
| 2009/0011543 A1* | 1/2009 | Karta | .................. | H01L 21/561 438/114 |
| 2015/0187742 A1* | 7/2015 | Kwon | .................. | H01L 24/82 257/774 |

FOREIGN PATENT DOCUMENTS

| | | |
|---|---|---|
| KR | 10-0800135 B1 | 2/2008 |
| KR | 10-1474135 B1 | 12/2014 |

* cited by examiner

*Primary Examiner* — William Harriston
(74) *Attorney, Agent, or Firm* — McDermott Will & Emery LLP

(57) ABSTRACT

A fan-out semiconductor package includes: a first interconnection member having a through-hole; a semiconductor chip disposed in the through-hole and having an active surface having connection pads disposed thereon and an inactive surface opposing the active surface; an encapsulant filling at least portions of spaces between walls of the through-hole and side surfaces of the semiconductor chip; and a second interconnection member disposed on the active surface of the semiconductor chip and including a redistribution layer electrically connected to the connection pads of the semiconductor chip through vias, wherein the side surface of the semiconductor chip has a step portion.

20 Claims, 14 Drawing Sheets

I-I'

II-II'

FAN-OUT SEMICONDUCTOR PACKAGE

CROSS-REFERENCE TO RELATED APPLICATION(S)

This application claims benefit of priority to Korean Patent Application No. 10-2016-0125322 filed on Sep. 29, 2016 in the Korean Intellectual Property Office, the disclosure of which is incorporated herein by reference in its entirety.

TECHNICAL FIELD

The present disclosure relates to a semiconductor package, and more particularly, to a fan-out semiconductor package in which connection terminals may extend outwardly of a region in which a semiconductor chip is disposed.

BACKGROUND

A significant recent trend in the development of technology related to semiconductor chips has been to reduce the size of semiconductor chips. Therefore, in the case of package technology, in accordance with a rapid increase in demand for small-sized semiconductor chips, or the like, the implementation of a semiconductor package having a compact size while including a plurality of pins has been demanded.

One type of package technology suggested to satisfy the technical demand described above is a fan-out package. Such a fan-out package has a compact size and may allow a plurality of pins to be implemented by redistributing connection terminals outwardly of a region in which a semiconductor chip is disposed.

SUMMARY

An aspect of the present disclosure may provide a fan-out semiconductor package in which close adhesion between a semiconductor chip and an encapsulant encapsulating the semiconductor chip may be improved.

According to an aspect of the present disclosure, a fan-out semiconductor package may be provided, in which a interconnection member having a through-hole is formed, a semiconductor chip is disposed in the through-hole, the semiconductor chip is encapsulated by the encapsulant, and a step portion is formed on a side surface of the semiconductor chip.

According to an aspect of the present disclosure, a fan-out semiconductor package may include: a first interconnection member having a through-hole; a semiconductor chip disposed in the through-hole and having an active surface having connection pads disposed thereon and an inactive surface opposing the active surface; an encapsulant filling at least portions of spaces between walls of the through-hole and side surfaces of the semiconductor chip; and a second interconnection member disposed on the active surface of the semiconductor chip and including a redistribution layer electrically connected to the connection pads of the semiconductor chip through vias, wherein the side surface of the semiconductor chip has a step portion.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or omitted for clarity.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
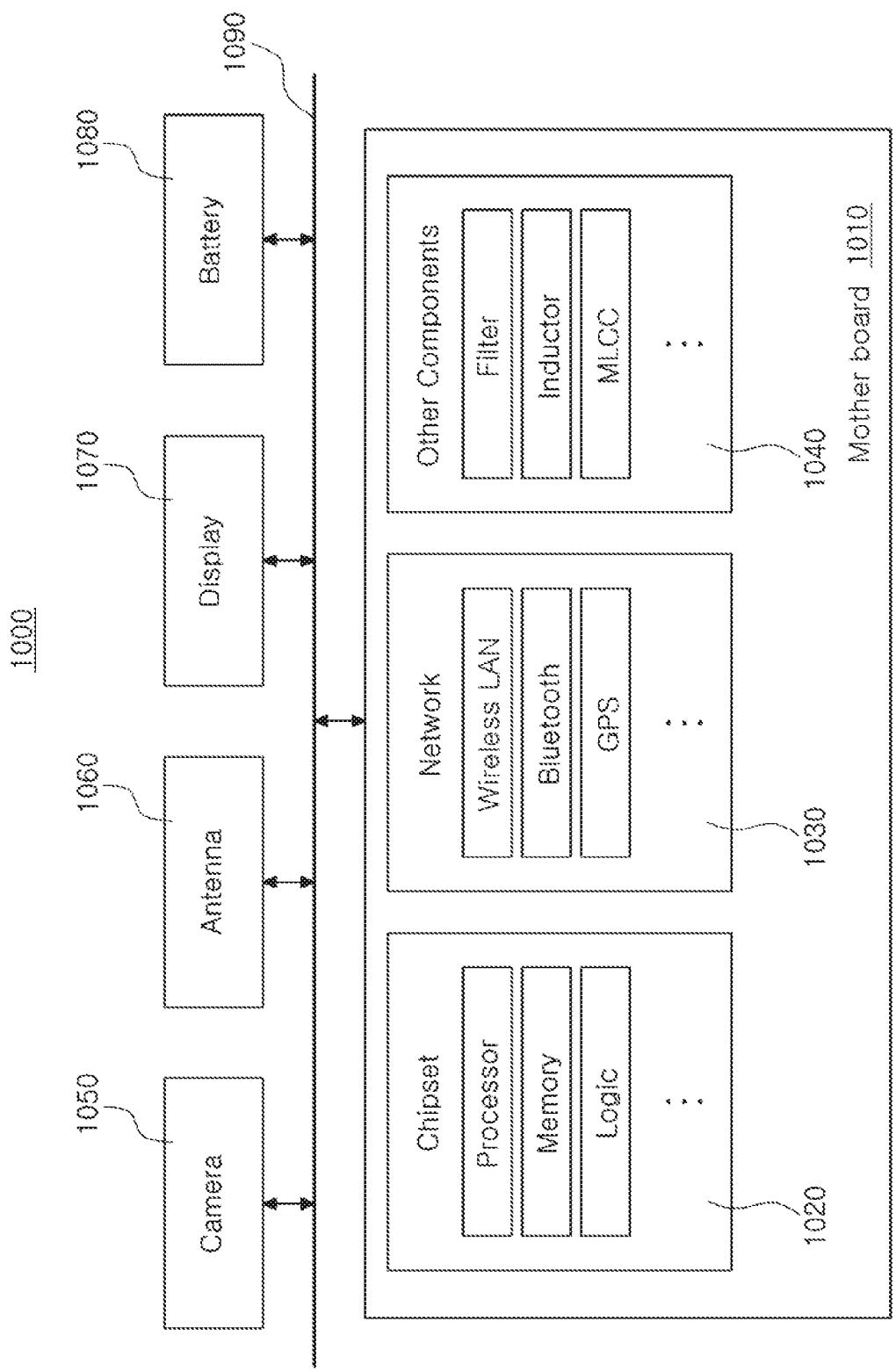
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mother board 1010 therein. The mother board 1010 may include chip-related components 1020, network-related components 1030, other components 1040, and the like, physically or electrically connected thereto. These components may be connected to others to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip-related components 1020 are not limited thereto, and may also include other types of chip-related components. In addition, the chip-related components 1020 may be combined with each other.

The network-related components 1030 may be compatible with protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, and may also include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip-related components 1020 or the network-related components 1030 described above.

Depending on a type of the electronic device 1000, the electronic device 1000 may include other components that may or may not be physically or electrically connected to the mother board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
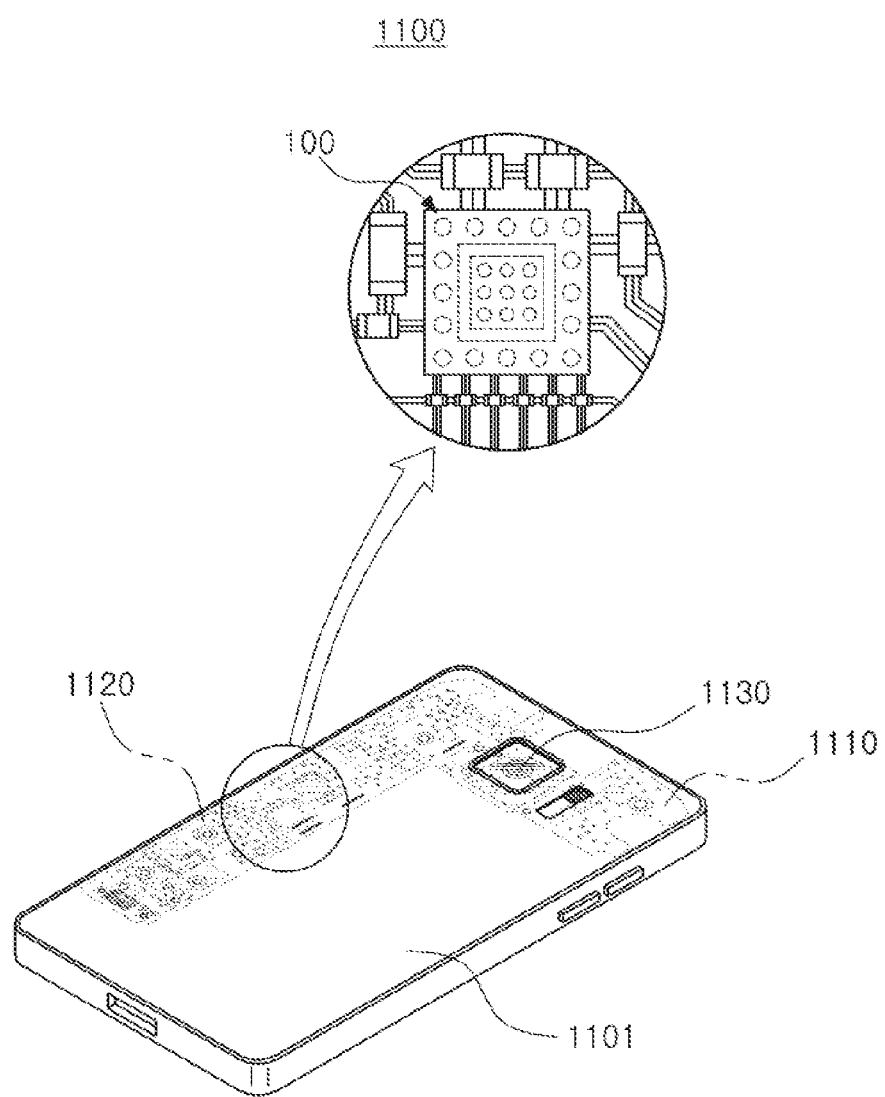
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as a camera module 1130, may be accommodated in the body 1101. Some of the electronic components 1120 may be the chip-related components, and the semiconductor package 100 may be, for example, an application processor among the chip-related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in circuit widths between the semiconductor chip and a main board of the electronic device in terms of electrical connections. In detail, a size of connection pads of the semiconductor chip and intervals between the connection pads of the semiconductor chip are very fine, while sizes of component mounting pads of the main board used in the electronic device and intervals between the component mounting pads of the main board are significantly larger than those of the semiconductor chip. Therefore, it may be difficult to directly mount the semiconductor chip on the main board, and packaging technology for buffering a difference in circuit widths between the semiconductor chip and the main board is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3B:
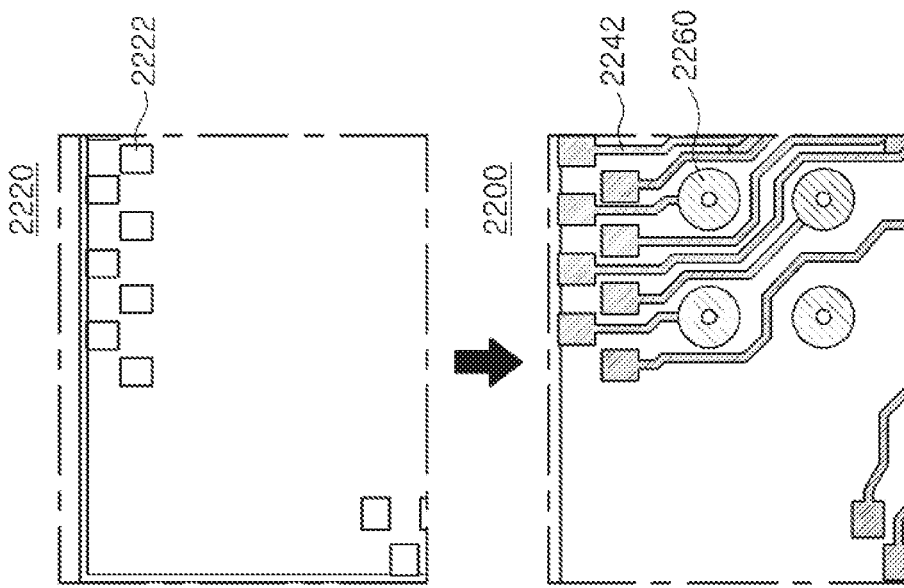
FIGS. 3A and 3B are schematic cross-sectional views illustrating states of a fan-in semiconductor package before and after being packaged.
Figure 3A:
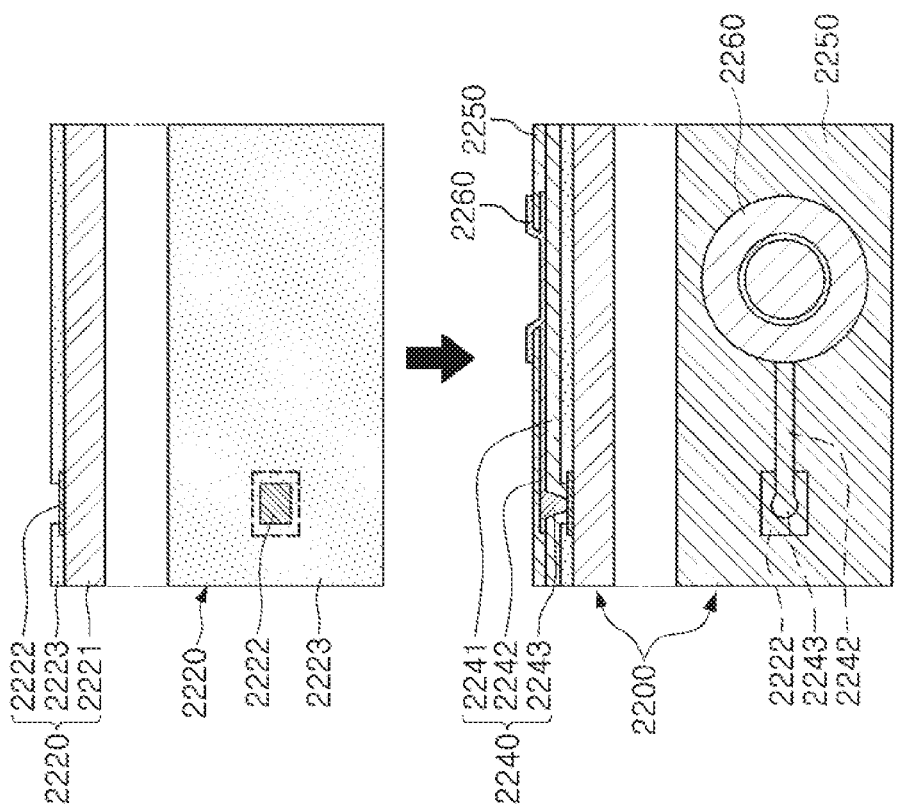

FIGS. 3A and 3B are schematic cross-sectional views illustrating states of a fan-in semiconductor package before and after being packaged.

Figure 4:
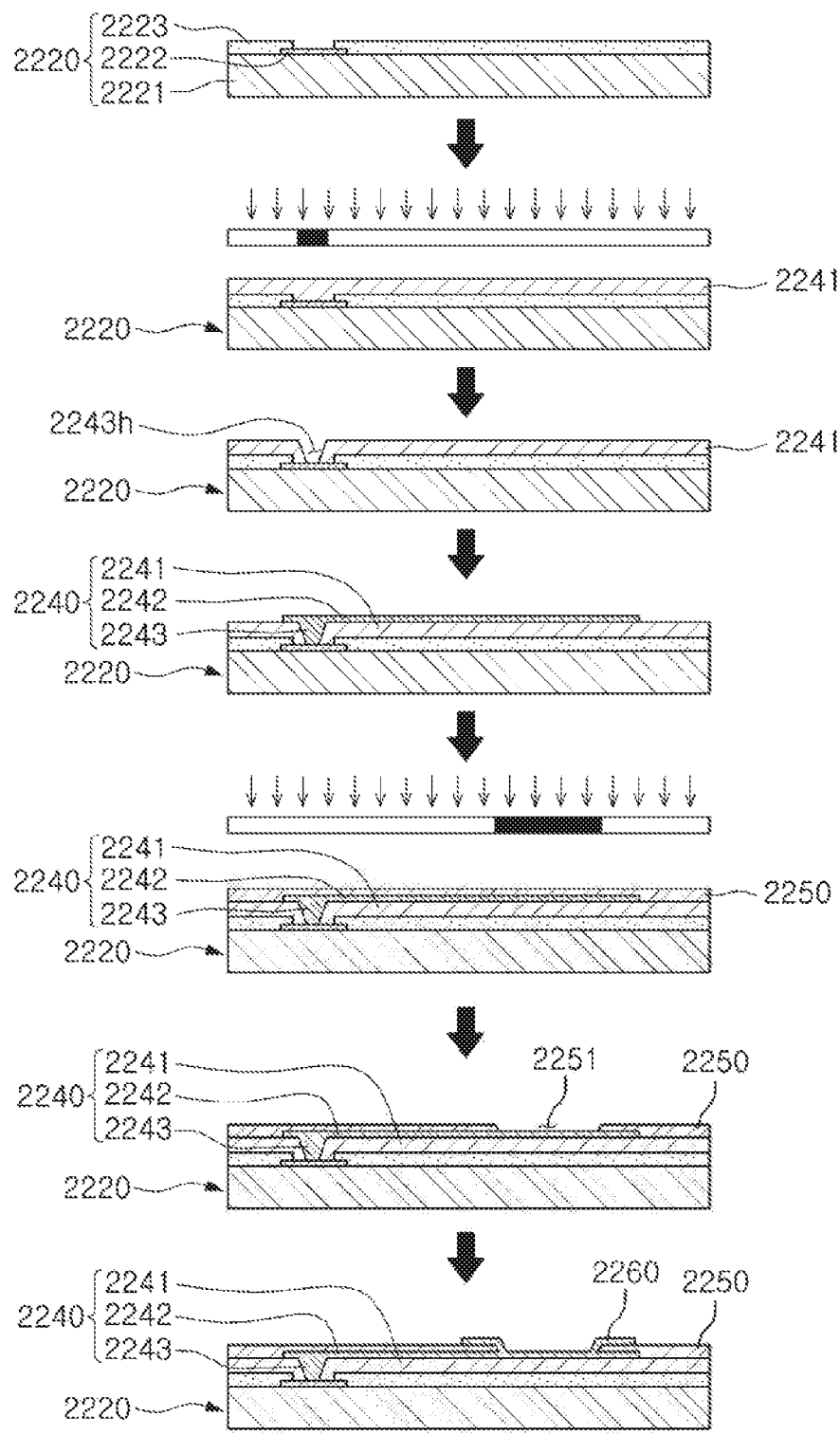
FIG. 4 is schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, a interconnection member 2240 may be formed on the semiconductor chip 2220 depending on a size thereof in order to redistribute the connection pads 2222. The interconnection member 2240 may be formed by forming an insulating layer 2241 on the semiconductor chip 2220 using an insulating material such as a photoimagable dielectric (PID) resin, forming via holes 2243*h* opening the connection pads 2222, and then forming wiring patterns 2242 and vias 2243. Then, a passivation layer 2250 protecting the interconnection member 2240 may be formed, an opening 2251 may be formed, and an under-bump metal layer 2260, or the like, may be formed. That is, a fan-in semiconductor package 2200 including, for example, the semiconductor chip 2220, the interconnection member 2240, the passivation layer 2250, and the under-bump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, may have excellent electrical characteristics and may be produced at a low cost. Therefore, many elements mounted in smartphones have been manufactured in fan-in semiconductor package form. In detail, many elements mounted in smartphones have been developed to allow rapid signal transfer to be implemented while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. Here, even in the case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
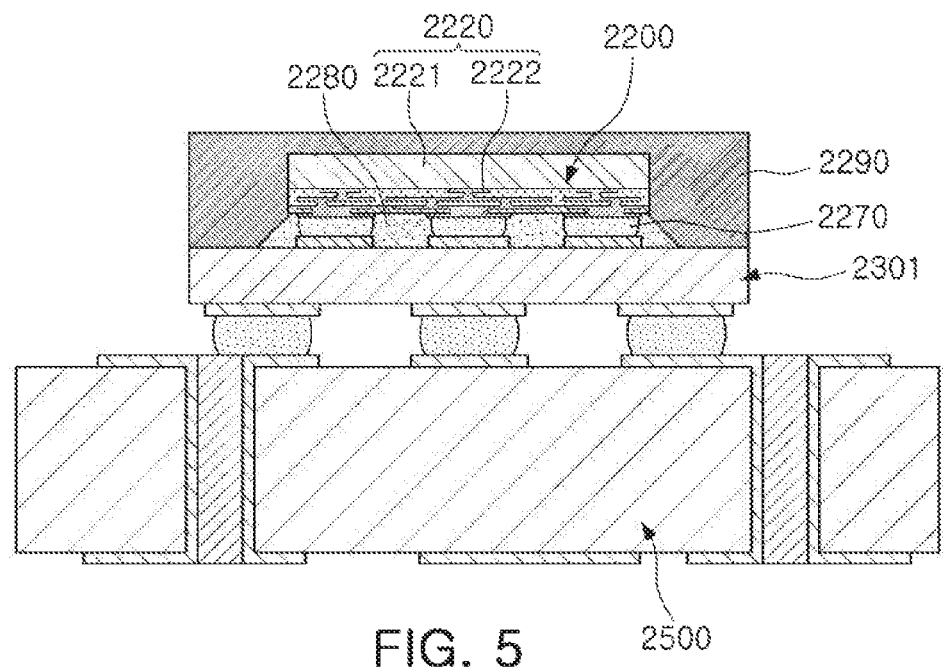
FIG. 5 is a schematic cross-sectional view illustrating a case in which a fan-in semiconductor package is mounted on an interposer substrate and is ultimately mounted on a main board of an electronic device.

FIG. 5 is a schematic cross-sectional view illustrating a case in which a fan-in semiconductor package is mounted on an interposer substrate and is ultimately mounted on a main board of an electronic device.

Figure 6:
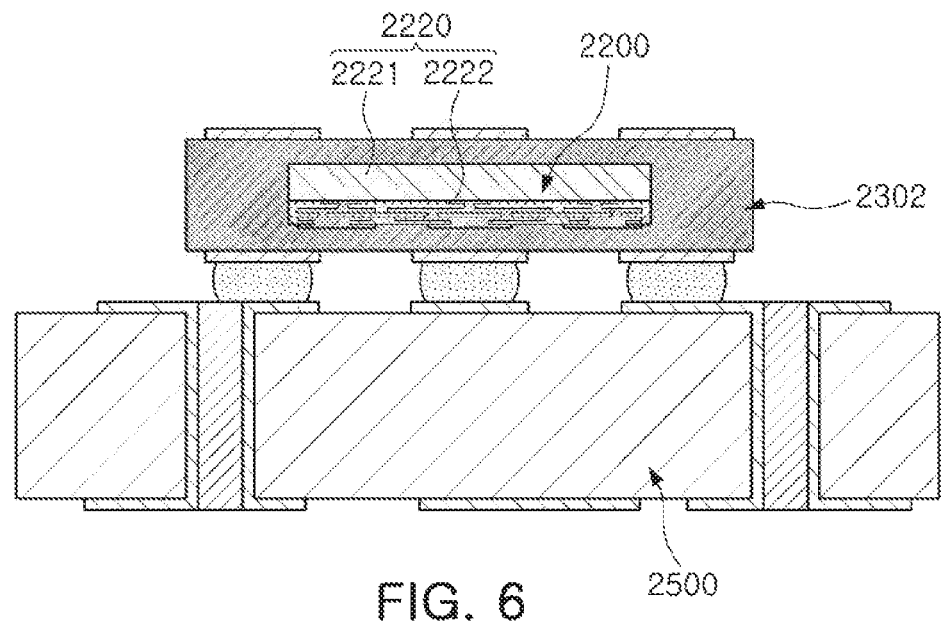
FIG. 6 is a schematic cross-sectional view illustrating a case in which a fan-in semiconductor package is embedded in an interposer substrate and is ultimately mounted on a main board of an electronic device.

FIG. 6 is a schematic cross-sectional view illustrating a case in which a fan-in semiconductor package is embedded in an interposer substrate and is ultimately mounted on a main board of an electronic device.

Referring to the drawings, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a main board 2500 of an electronic device in a state of being mounted on the interposer substrate 2301. In this case, solder balls 2270, and the like, may be fixed by an underfill resin 2280, or the like, and an external surface of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Fan-Out Semiconductor Package

Figure 7:
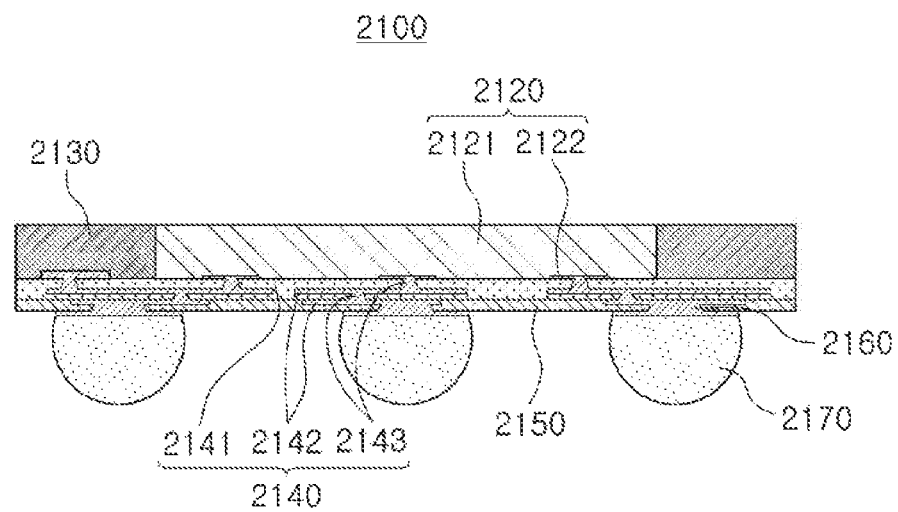
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an external surface of a semiconductor chip 2120 may be protected by an encapsulant 2130, and connection pads 2122 of the semiconductor chip 2120 may be redistributed outwardly of the semiconductor chip 2120 by a interconnection member 2140. In this case, a passivation layer 2150 may further be formed on the interconnection member 2140, and an under-bump metal layer 2160 may further be formed in openings of the passivation layer 2150. Solder balls 2170 may further be formed on the under-bump metal layer 2160. The semiconductor chip 2120 may be an integrated circuit (IC) including a body 2121, the connection pads 2122, a passivation layer (not illustrated), and the like. The interconnection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the interconnection member formed on the semiconductor chip. As described above, in the fan-in semiconductor package, all I/O terminals of the semiconductor chip need to be disposed inside the semiconductor chip. Therefore, when a size of the semiconductor chip is reduced, a size and a pitch of balls need to be reduced, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the interconnection member formed on the semiconductor chip as described above. Therefore, even in the case that a size of the semiconductor chip is reduced, a standardized ball layout may be used in the fan-out semiconductor package as it is, such that the fan-out semiconductor package may be mounted on the main board of the electronic device without using a separate interposer substrate, as described below.

Figure 8:
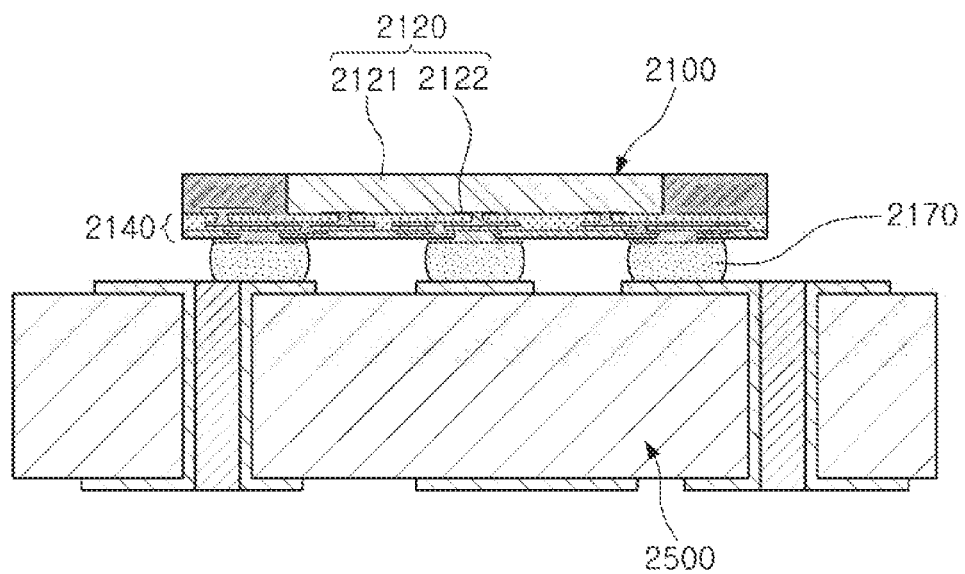
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the interconnection member 2140 formed on the semiconductor chip 2120 and capable of redistributing the connection pads 2122 to a fan-out region outside of an area of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented to have a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type semiconductor package using a printed circuit board (PCB), and may solve a problem occurring due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is conceptually different from a printed circuit board (PCB) such as an interposer substrate, or the like, having a scale, a purpose, and the like, different from those of the fan-out semiconductor package, and having the fan-in semiconductor package embedded therein.

A fan-out semiconductor package in which close adhesion between a semiconductor chip and an encapsulant encapsulating the semiconductor chip may be improved will hereinafter be described with reference to the drawings.

Figure 9:
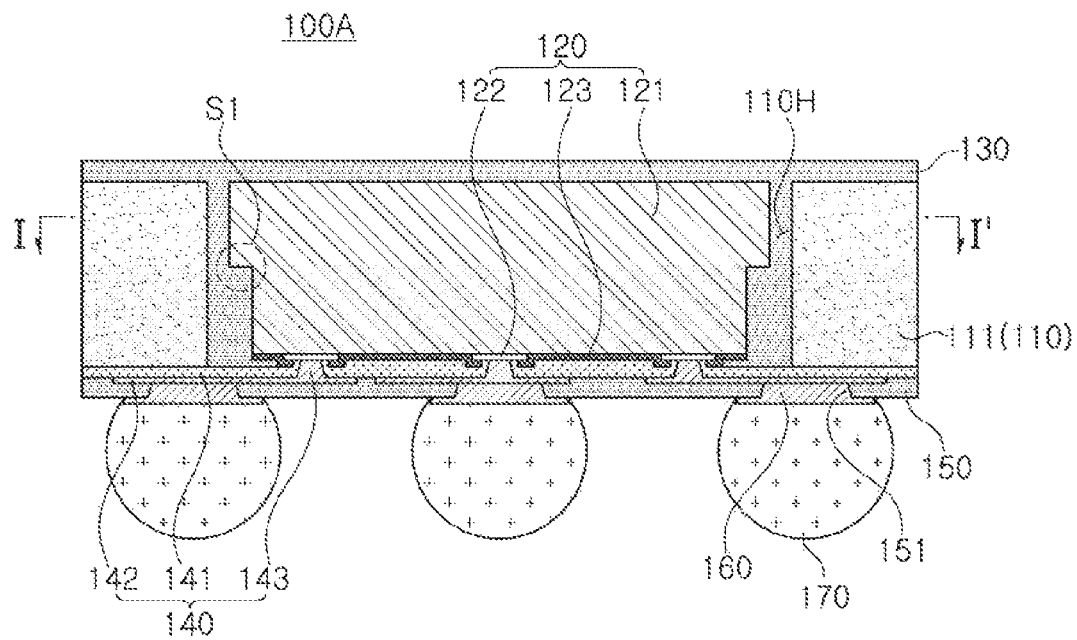
FIG. 9 is a schematic cross-sectional view illustrating an example of a fan-out semiconductor package.

FIG. 9 is a schematic cross-sectional view illustrating an example of a fan-out semiconductor package.

Figure 10:
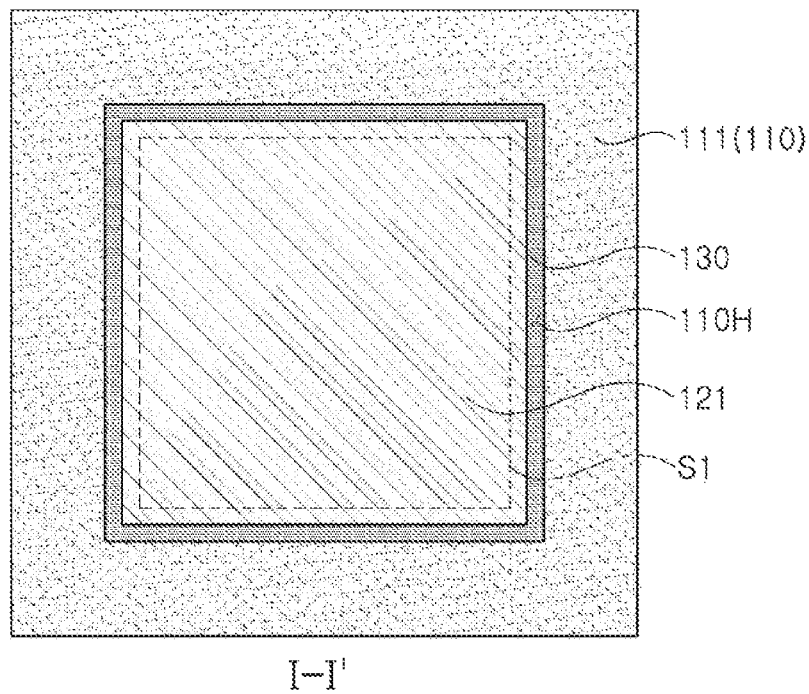
FIG. 10 is a schematic plan view taken along line I-I' of the fan-out semiconductor package of FIG. 9.

FIG. 10 is a schematic plan view taken along line I-I' of the fan-out semiconductor package of FIG. 9.

Referring to the drawings, a fan-out semiconductor package 100A according to an exemplary embodiment in the present disclosure may include a first interconnection member 110 having a through-hole 110H, a semiconductor chip 120 disposed in the through-hole 110H and having an active surface having connection pads 122 disposed thereon and an inactive surface opposing the active surface, an encapsulant 130 filling at least portions of spaces between walls of the through-hole 110H and side surfaces of the semiconductor chip 120, and a second interconnection member 140 disposed on the active surface of the semiconductor chip 120 and including a redistribution layer 142 electrically connected to the connection pads 122 of the semiconductor chip 120 through vias 143. The side surface of the semiconductor chip 120 may have a step portion S1.

Recently, a fan-out semiconductor package has been developed to be appropriate for a mobile application processor, a control system for an electrical device, or the like. Since the chips themselves of these products are relatively expensive, bonding force or close adhesion between materials is important in view of reliability, in order to prevent delamination between the materials. However, in general, the fan-out semiconductor package has been manufactured by simply dicing semiconductor chips formed on a wafer by a blade, or the like, encapsulating the semiconductor chips with an encapsulant, and then forming redistribution layers on the respective semiconductor chips. However, in this case, the semiconductor chips having vertical side surfaces are simply encapsulated by the encapsulant, and it is thus difficult to sufficiently fix the semiconductor chips. Therefore, a problem in reliability such as delamination between the semiconductor chip and the encapsulant in a severe environment such as a thermal cycle, a drop, or the like, may occur.

On the other hand, in the fan-out semiconductor package 100A according to the exemplary embodiment, the first interconnection member 110 having the through-hole 110H is introduced, the semiconductor chip 120 is disposed in the through-hole 110H, and the semiconductor chip 120 is encapsulated by the encapsulant 130. In this case, the encapsulant 130 may fill at least portions of the spaces between the walls of the through-hole 110H and the side surfaces of the semiconductor chip 120 to fix the semiconductor chip 120 to the walls of the through-hole 110H and reduce buckling of the semiconductor chip 120 by a stress alleviating effect. Particularly, the side surface of the semiconductor chip 120 may have the step portion S1. That is, the side surface of the semiconductor chip 120 fixed to the wall of the through-hole 110H may have a staircase-shaped cross section rather than a simple vertical cross section. In this case, a bonded area between the encapsulant 130 and the semiconductor chip 120 may be increased to improve close adhesion between the encapsulant 130 and the semiconductor chip 120. Therefore, the effect that the semiconductor chip 120 is fixed to the wall as described above may be significantly increased.

Meanwhile, the step portion S1 of the semiconductor chip 120 may be formed so that a width of the active surface is smaller than that of the inactive surface. That is, the step portion S1 may be formed stepwise from the active surface toward the inactive surface. In this case, an anchoring effect may be accomplished by the encapsulant 130 filling the space between the semiconductor chip 120 and the second interconnection member 140. Therefore, structural stability of the fan-out semiconductor package 100A may be further improved, and reliability of the fan-out semiconductor package 100A may be significantly increased.

Meanwhile, the encapsulant 130 may also encapsulate at least portions of the first interconnection member 110 and inactive surface of the semiconductor chip 120. In this case, the encapsulant 130 may better fix the semiconductor chip 120, and upwardly disperse stress of the semiconductor chip 120. Therefore, warpage of the fan-out semiconductor package 100A may also be alleviated.

The respective components included in the fan-out semiconductor package 100A according to the exemplary embodiment will hereinafter be described in more detail.

The first interconnection member 110 may maintain rigidity of the fan-out semiconductor package 100A depending on materials of the first interconnection member 110, and serve to secure uniformity of a thickness of the encapsulant 130. The through-hole 110H may have the semiconductor chip 120 disposed therein to be spaced apart from the first interconnection member 110 by a predetermined distance. The side surfaces of the semiconductor chip 120 may be surrounded by the first interconnection member 110. Therefore, the semiconductor chip 120 may be fixed to the walls of the through-hole 110H by the encapsulant 130. However, such a form is only an example and may be variously modified to have other forms, and the fan-out semiconductor package 100A may have another function, depending on such a form.

The first interconnection member 110 may be formed of an insulating layer 111. A material of the insulating layer 111 is not particularly limited. For example, an insulating material may be used as the material of the insulating layer 111. In this case, the insulating material may be a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), for example, prepreg, an unclad copper clad laminate (CCL), or the like. However, the insulating material is not limited thereto.

The semiconductor chip 120 may be an integrated circuit (IC) provided in an amount of several hundreds to several millions of elements or more integrated in a single chip. The IC may be, for example, an application processor chip such as a central processor (for example, a CPU), a graphics processor (for example, a GPU), a digital signal processor, a cryptographic processor, a microprocessor, a microcontroller, or the like, but is not limited thereto. The semiconductor chip 120 may include a body 121, the connection pads 122 formed on the body 121, a passivation layer 123 formed on the body and exposing at least portions of the connection pads 122, and the like.

The semiconductor chip 120 may be formed on the basis of an active wafer. In this case, a base material of the body 121 may be silicon (Si), germanium (Ge), gallium arsenide (GaAs), or the like. Various circuits may be formed on the body 121. The connection pads 122 may electrically connect the semiconductor chip 120 to other components. A material of the connection pads 122 may be a conductive material such as aluminum (Al), or the like. The passivation layer 123 may be an oxide film, a nitride film, or the like, or be a double layer of an oxide layer and a nitride layer. A lower surface of the connection pads 122 may have a step portion with respect to a lower surface of the encapsulant 130 through the passivation layer 123. Resultantly, a phenomenon in which the encapsulant 130 bleeds into the lower surface of the connection pads 122 may be prevented to some extent. An insulating layer, and the like, may also be further disposed in required positions.

The side surface of the semiconductor chip 120 may have the step portion S1. That is, the side surface of the semiconductor chip 120 fixed to the wall of the through-hole 110H may have the staircase-shaped cross section rather than the simple vertical cross section. Therefore, the bonded area between the encapsulant 130 and the semiconductor chip 120 may be increased to improve the close adhesion between the encapsulant 130 and the semiconductor chip 120. Therefore, the effect that the semiconductor chip 120 is fixed to the wall as described above may be significantly increased. The step portion S1 of the semiconductor chip 120 may be formed so that the width of the active surface is smaller than that of the inactive surface. That is, the step portion S1 may be formed stepwise from the active surface toward the inactive surface. In this case, the anchoring effect may be accomplished by the encapsulant 130 filling the space between the semiconductor chip 120 and the second interconnection member 140. Therefore, the structural stability of the fan-out semiconductor package 100A may be further improved, and the reliability of the fan-out semiconductor package 100A may be significantly increased.

The encapsulant 130 may protect the semiconductor chip 120. An encapsulation form of the encapsulant 130 is not particularly limited. For example, the encapsulant 130 may cover the first interconnection member 110 and the inactive surface of the semiconductor chip 120, and may fill at least portions of the spaces between the walls of the through-hole 110H and the side surfaces of the semiconductor chip 120. In addition, the encapsulant 130 may also fill at least a portion of a space between the passivation layer 123 of the semiconductor chip 120 and the second interconnection member 140. Meanwhile, the encapsulant 130 may fill the through-hole 110H to fix the semiconductor chip 120 to the walls of the through-hole 110H and reduce the buckling of the semiconductor chip 120.

A material of the encapsulant 130 is not particularly limited. For example, an insulating material may be used as the material of the encapsulant 130. In this case, the insulating material may be a material including an inorganic filler and an insulating resin, for example, a thermosetting resin such as an epoxy resin, a thermoplastic resin such as a polyimide resin, or a resin having a reinforcing material such as an inorganic filler impregnated in the thermosetting resin and the thermoplastic resin, more specifically, Ajinomoto Build up Film (ABF), FR-4, Bismaleimide Triazine (BT), a photoimagable dielectric (PID) resin, or the like. In addition, a known molding material such as an epoxy molding compound (EMC), or the like, may also be used. Alternatively, a material in which a thermosetting resin or a thermoplastic resin is impregnated together with an inorganic filler in a core material such as a glass fiber (or a glass cloth or a glass fabric), for example, prepreg, or the like, may also be used as the insulating material.

The second interconnection member 140 may be configured to redistribute the connection pads 122 of the semiconductor chip 120. Several tens to several hundreds of connection pads 122 having various functions may be redistributed by the second interconnection member 140, and may be physically or electrically connected to an external source through connection terminals 170 to be described below depending on the functions. The second interconnection member 140 may include insulating layers 141, the redistribution layers 142 disposed on the insulating layers 141, and vias 143 penetrating through the insulating layers 141 and electrically connecting the redistribution layers 142 to the connection pads 122. The second interconnection member 140 may also be formed of a plurality of layers, if necessary.

An insulating material may be used as a material of the insulating layers 141. In this case, the insulating material may be a photosensitive insulating material such as a photoimagable dielectric (PID) resin, but is not limited thereto. That is, the insulating layer 141 may be a photosensitive insulating layer, if necessary. In a case in which the insulating layer 141 has photosensitive properties, the insulating layer 141 may be formed to have a smaller thickness, and a fine pitch of the via 143 may be achieved more easily. The insulating layer 141 may be a photosensitive insulating layer including an insulating resin and an inorganic filler. When the insulating layers 141 are multiple layers, materials of the insulating layers 141 may be the same as each other, and may also be different from each other, if necessary. When the insulating layers 141 are multiple layers, the insulating layers 141 may be integrated with each other depending on a process, such that a boundary therebetween may also not be apparent.

The redistribution layers 142 may serve to substantially redistribute the connection pads 122. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may have various functions depending on designs of layers corresponding thereto. For example, the redistribution layers 142 may include a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, the redistribution layers 142 may include a via pad, and the like. A surface treatment layer (not illustrated) may be formed on surfaces of some of the pad patterns, or the like, exposed from the redistribution layer 142 of the second interconnection member 140 through openings 151 formed in a passivation layer 150, if necessary. The surface treatment layer may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like, but is not limited thereto.

The vias 143 may electrically connect the connection pads 122, the redistribution layers 142, or the like, formed on different layers to each other, resulting in an electrical path in the fan-out semiconductor package 100A. A material of each of the vias 143 may be a conductive material such as copper (Cu), aluminum (Al), silver (Ag), tin (Sn), gold (Au), nickel (Ni), lead (Pb), titanium (Ti), or alloys thereof. The via 143 may be entirely filled with the conductive material, or the conductive material may also be formed along a wall of the via. In addition, the via 143 may have all shapes known in the related art, such as a tapered shape, a cylindrical shape, and the like.

The passivation layer 150 may be additionally configured to protect the redistribution layer 142 of the second interconnection member 140 from external physical or chemical damage. The passivation layer 150 may have the openings 151 exposing at least portions of the redistribution layer 142 of the second interconnection member 140. The number of openings formed in the passivation layer 150 may be several tens to several thousands. A material of the passivation layer 150 is not particularly limited, but may be, for example, ABF that does not include a glass fiber (or a glass cloth or a glass fabric), but includes an inorganic filler and an insulating resin, or the like. When the ABF, or the like, is used as the material of the passivation layer 150, a weight percent of the inorganic filler included in the passivation layer 150 may be greater than that of the inorganic filler included in the insulating layer 141 of the second interconnection member 140. In this condition, reliability may be improved. However, the material of the passivation layer 150 is not limited thereto, but may also be a known PID or a solder resist.

An under-bump metal layer 160 may be additionally configured to improve connection reliability of the connection terminals 170 and improve board level reliability of the fan-out semiconductor package 100A. The under-bump metal layer 160 may be electrically connected to the redistribution layer 142 of the second interconnection member 140 exposed through the openings 151 of the passivation layer 150. The under-bump metal layer 160 may be formed in the openings 151 of the passivation layer 150 by a known metallization method using a known conductive material such as a metal, but is not limited thereto.

The connection terminals 170 may be additionally configured to physically or electrically externally connect the fan-out semiconductor package 100A. For example, the fan-out semiconductor package 100A may be mounted on the main board of the electronic device through the connection terminals 170. Each of the connection terminals 170 may be formed of a conductive material, for example, a solder, or the like. However, this is only an example, and a material of each of the connection terminals 170 is not limited thereto. Each of the connection terminals 170 may be a land, a ball, a pin, or the like. The connection terminals 170 may be formed as a multilayer or single layer structure. When the connection terminals 170 are formed as a multilayer structure, the connection terminals 170 may include a copper (Cu) pillar and a solder. When the connection terminals 170 are formed as a single layer structure, the connection terminals 170 may include a tin-silver solder or copper (Cu). However, this is only an example, and the connection terminals 170 are not limited thereto.

The number, interval, disposition, or the like, of the connection terminals 170 is not particularly limited, and may be sufficiently modified by a person skilled in the art depending on design particulars. For example, the connection terminals 170 may be provided in an amount of several tens to several thousands according to the number of connection pads 122 of the semiconductor chip 120, but are not limited thereto, and may also be provided in an amount of several tens to several thousands or more or several tens to several thousands or less. When the connection terminals 170 are solder balls, the connection terminals 170 may cover side surfaces of the under-bump metal layer 160 extending onto one surface of the passivation layer 150, and connection reliability may be more excellent.

At least one of the connection terminals 170 may be disposed in a fan-out region. The fan-out region is a region except for the region in which the semiconductor chip 120 is disposed. That is, the fan-out semiconductor package 100A according to the exemplary embodiment may be a fan-out package. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be mounted on an electronic device without a separate board. Thus, the fan-out package may be manufactured to have a reduced thickness, and may have price competitiveness.

Although not illustrated in the drawings, a metal layer may be further disposed on an inner wall of the through-hole 110H of the first interconnection member 110, if necessary. That is, the side surfaces of the semiconductor chip 120 may also be surrounded by the metal layer. Heat generated from the semiconductor chip 120 may be effectively dissipated upwardly or downwardly of the fan-out semiconductor package 100A through the metal layer, and electromagnetic waves may be effectively blocked by the metal layer. In addition, if necessary, a plurality of semiconductor chips may be disposed in the through-hole 110H of the first interconnection member 110, and the number of through-holes 110H of the first interconnection member 110 may be plural and semiconductor chips may be disposed in the through-holes, respectively. In addition, separate passive components such as a condenser, an inductor, and the like, may be encapsulated together with the semiconductor chip in the through-hole 110H. In addition, a surface mounted component may also be mounted on the passivation layer 150 to be disposed on a level that is substantially the same as that of the connection terminal 170.

Figure 11:
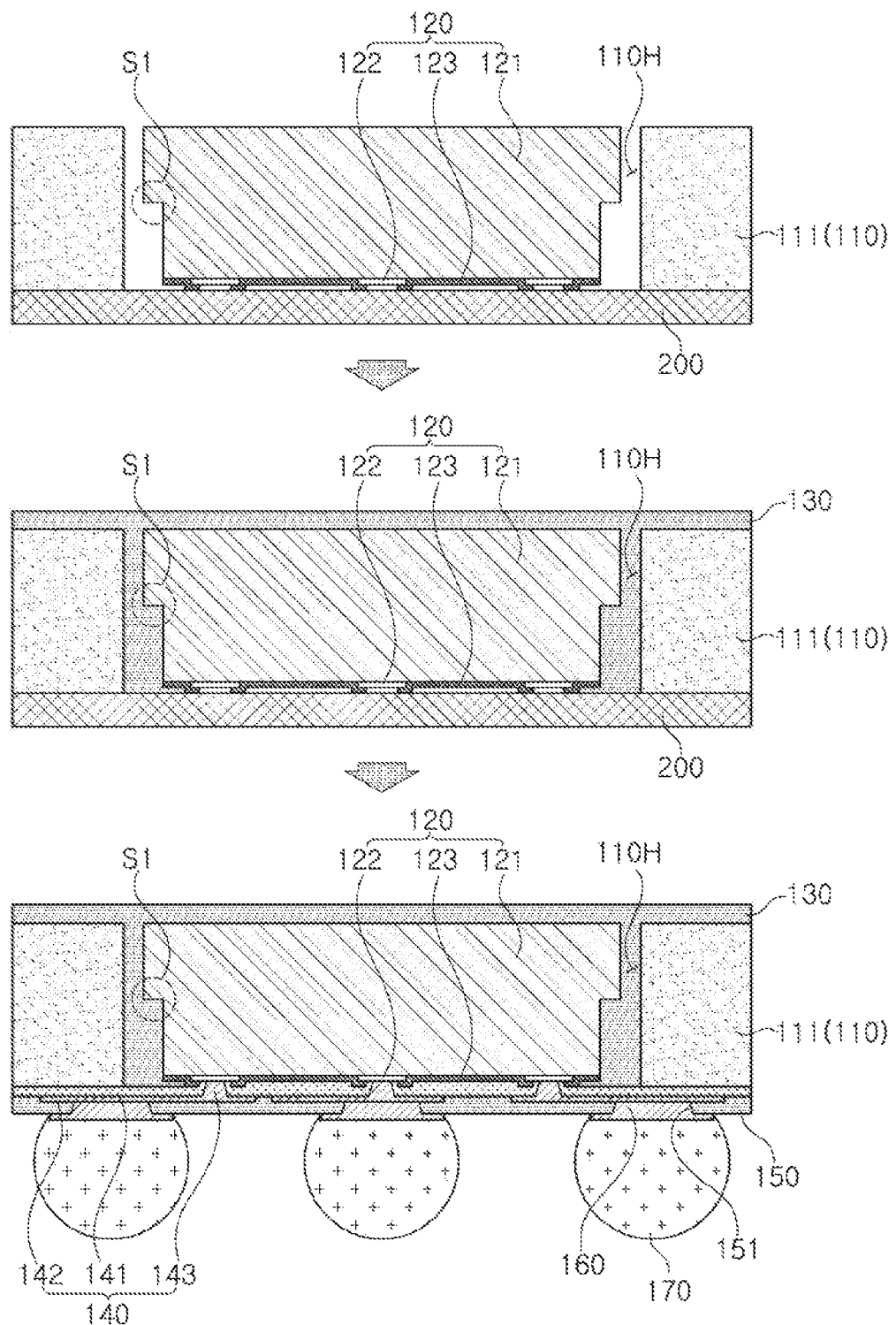
FIG. 11 is schematic views illustrating an example of processes of manufacturing the fan-out semiconductor package of FIG. 9.

FIG. 11 is schematic views illustrating an example of processes of manufacturing the fan-out semiconductor package of FIG. 9.

Referring to the drawing, the first interconnection member 110 may first be prepared. Then, the first interconnection member 110 may be attached to a temporary film 200 such as an adhesive film, or the like. Then, the semiconductor chip 120 may be attached to the temporary film 200 exposed through the through-hole 110H in a face-down form to thus be disposed in the through-hole 110H. Meanwhile, the step portion S1 may be formed on the side surface of the semiconductor chip 120 before the semiconductor chip 120 is disposed. The step portion S1 may be artificially formed by dicing the semiconductor chip 120 using a dual blade, cutting tips of which are disposed at different heights. In this case, the dicing may be performed on the active surface of the semiconductor chip 120 on which the connection pads 122 are disposed. Therefore, the step portion S1 may be formed so that the width of the active surface is smaller than that of the inactive surface.

Then, at least portions of the semiconductor chip 120 may be encapsulated using the encapsulant 130. The encapsulant 130 may be formed by a known method. For example, the encapsulant 130 may be formed by a method of laminating a precursor of the encapsulant 130 on the temporary film 200 and then hardening the precursor. Alternatively, the encapsulant 130 may be formed by a method of applying a pre-encapsulant to the temporary film 200 to encapsulate the semiconductor chip 120 and then hardening the pre-encapsulant. For example, the encapsulant 130 may encapsulate at least portions of the first interconnection member 110 and the inactive surface of the semiconductor chip 120, and fill at least portions of the spaces between the walls of the through-hole 110H and the side surfaces of the semiconductor chip 120.

Then, the temporary film 200 may be removed. Then, the second interconnection member 140 may be formed in a region in which the temporary film 200 is removed. Then, the passivation layer 150, the under-bump metal layer 160, and the connection terminals 170 may be sequentially formed on the second interconnection member 140, if necessary. The second interconnection member 140 may be formed by forming the insulating layer 141 in the region from which the temporary film 200 is removed, forming holes for the vias 143, and then forming the redistribution layer 142 and the vias 143 by a known plating method. The passivation layer 150 may be formed by a known lamination and hardening method, a known applying and hardening method, or the like. The under-bump metal layer 160 may be formed by a known metallization method. The connection terminals 170 may also be formed by a known method depending on a kind and a material thereof.

Figure 12:
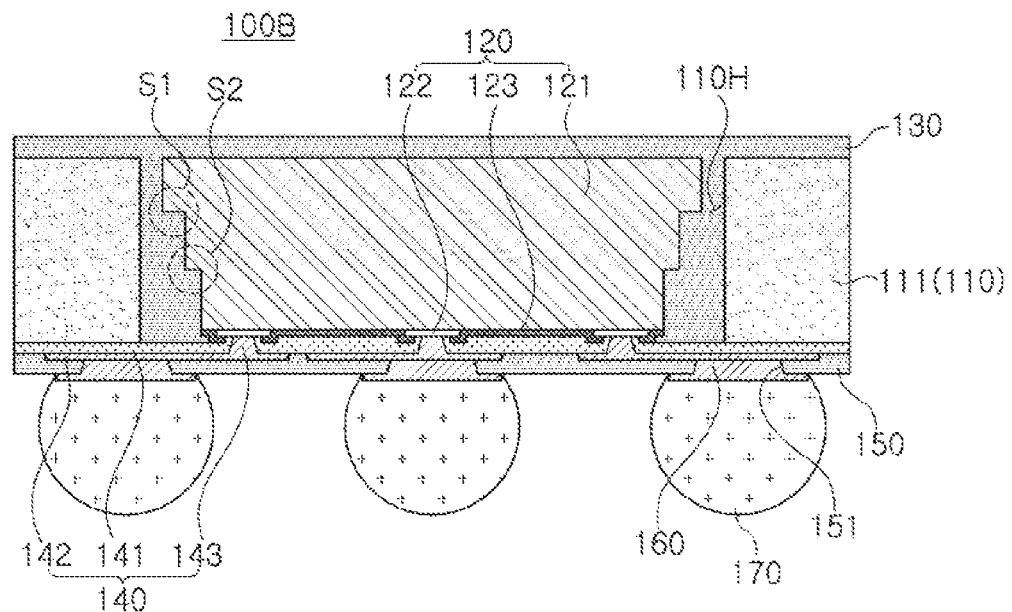
FIG. 12 is a schematic cross-sectional view illustrating a modified example of the fan-out semiconductor package of FIG. 9.

FIG. 12 is a schematic cross-sectional view illustrating a modified example of the fan-out semiconductor package of FIG. 9.

Referring to the drawing, in a fan-out semiconductor package 100B according to the modified example, a plurality of step portions S1 and S2 may be formed between an active surface and an inactive surface of a semiconductor chip 120. That is, the number of step portions S1 and S2 is not necessarily limited to one, but may also be plural. In a case in which the plurality of step portions S1 and S2 are formed, a connection area between an encapsulant 130 and the semiconductor chip 120 may be further increased, such that a reliability improving effect may be more excellent.

A description, or the like, of configurations other than the abovementioned configuration and a method for manufacturing the fan-out semiconductor package 100B may overlap the description provided above, and is thus omitted.

Figure 13:
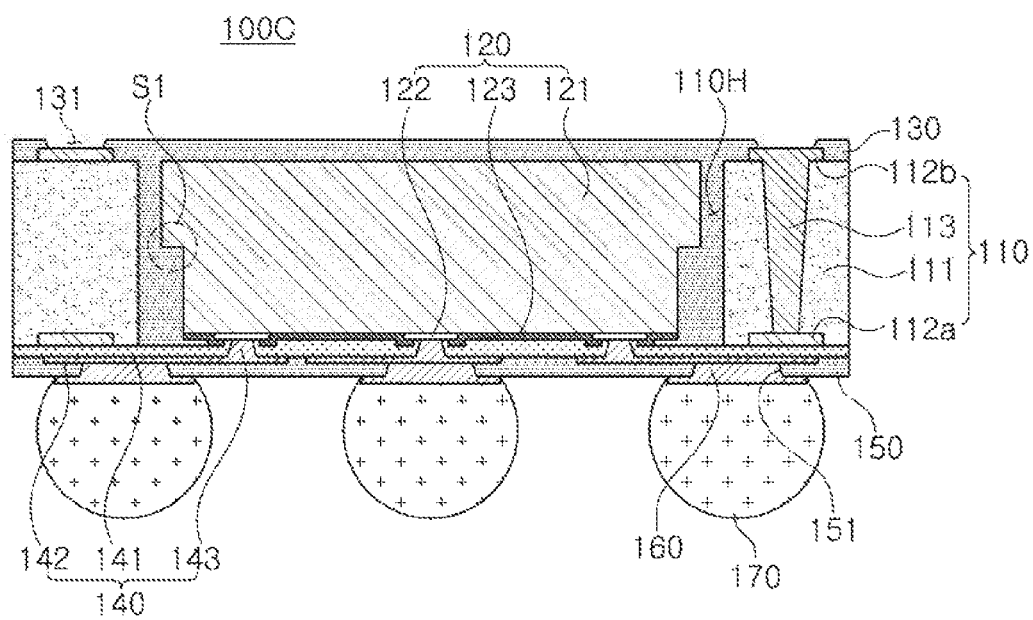
FIG. 13 is a schematic cross-sectional view illustrating another modified example of the fan-out semiconductor package of FIG. 9.

FIG. 13 is a schematic cross-sectional view illustrating another modified example of the fan-out semiconductor package of FIG. 9.

Referring to the drawing, in a fan-out semiconductor package 100C according to another modified example, a first interconnection member 110 may include an insulating layer 111, a first redistribution layer 112a in contact with a second interconnection member 140 and embedded in the insulating layer 111, and a second redistribution layer 112b disposed on the other surface of the insulating layer 111 opposing one surface of the insulating layer 111 in which the first redistribution layer 112a is embedded. The first interconnection member 110 may include vias 113 penetrating through the insulating layer 111 and electrically connecting the first and second redistribution layers 112a and 112b to each other. The first and second redistribution layers 112a and 112b may be electrically connected to connection pads 122. Due to the first interconnection member 110, the fan-out semiconductor package 100C may be used as a portion of a package-on-package. When the first redistribution layer 112a is embedded in the insulating layer 111, a step portion generated due to a thickness of the first redistribution layer 112a may be significantly reduced, and an insulating distance of the second interconnection member 140 may thus become constant. That is, a difference between a distance from a redistribution layer 142 of the second interconnection member 140 to a lower surface of the insulating layer 111 and a distance from the redistribution layer 142 of the second interconnection member 140 to the connection pads 122 may be smaller than a thickness of the first redistribution layer 112a. Therefore, a high density wiring design of the second interconnection member 140 may be facilitated.

A material of the insulating layer 111 is not particularly limited. For example, as described above, an insulating material may be used as the material of the insulating layer 111. In this case, the insulating material may be a thermosetting resin such as an epoxy resin, a thermoplastic resin such as a polyimide resin, a resin with which the thermosetting resin or the thermoplastic resin is impregnated together with an inorganic filler in a core material such as a glass fiber (or a glass cloth or a glass fabric), for example, prepreg, an unclad copper clad laminate (CCL), or the like. However, the insulating material is not limited thereto.

The redistribution layers 112a and 112b may serve to redistribute the connection pads 122 of a semiconductor chip 120, and a material of each of the redistribution layers 112a and 112b may be a conductive material such as copper (Cu), aluminum (Al), silver (Ag), tin (Sn), gold (Au), nickel (Ni), lead (Pb), titanium (Ti), or alloys thereof. The redistribution layers 112a and 112b may have various functions depending on designs of layers corresponding thereto. For example, the redistribution layers 112a and 112b may include a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, the redistribution layers 112a and 112b may include a via pad, a connection terminal pad, and the like. A surface treatment layer (not illustrated) may be formed on surfaces of pad patterns, or the like, exposed from the second redistribution layer 112b through openings 131, if necessary. The surface treatment layer (not illustrated) may be formed by, for example, electrolytic gold plating, electroless gold plating, OSP or electroless tin plating, electroless silver plating, electroless nickel plating/substituted gold plating, DIG plating, HASL, or the like.

The vias 113 may electrically connect the redistribution layers 112a and 112b formed on different layers to each other, resulting in an electrical path in the first interconnection member 110. A material of each of the vias 113 may be a conductive material. The via 113 may be entirely filled with the conductive material, or the conductive material may be formed along a wall of a via hole. In addition, each of the vias 113 may have all shapes known in the related art, such as a tapered shape, a cylindrical shape, and the like. Meanwhile, when holes for the vias 113 are formed, some of the pads of the first redistribution layer 112a may serve as a stopper, and it may be thus advantageous in a process that each of the vias 113 has the tapered shape of which a width of an upper surface is greater than that of a lower surface. In this case, the vias 113 may be integrated with portions of the second redistribution layer 112b.

Thicknesses of the redistribution layers 112a and 112b of the first interconnection member 110 may be greater than those of the redistribution layers 142 of the second interconnection member 140. Since the first interconnection member 110 may have a thickness equal to or greater than that of the semiconductor chip 120, the redistribution layers 112a and 112b may be formed to be large depending on a scale of the first interconnection member 110. On the other hand, the redistribution layer 142 of the second interconnection member 140 may be formed to be relatively small for thinness.

A description, or the like, of configurations other than the abovementioned configuration and a method for manufacturing the fan-out semiconductor package 100A may overlap the description provided above, and is thus omitted. Meanwhile, the description of the fan-out semiconductor package 100B described above may also be applied to the fan-out semiconductor package 100C.

Figure 14:
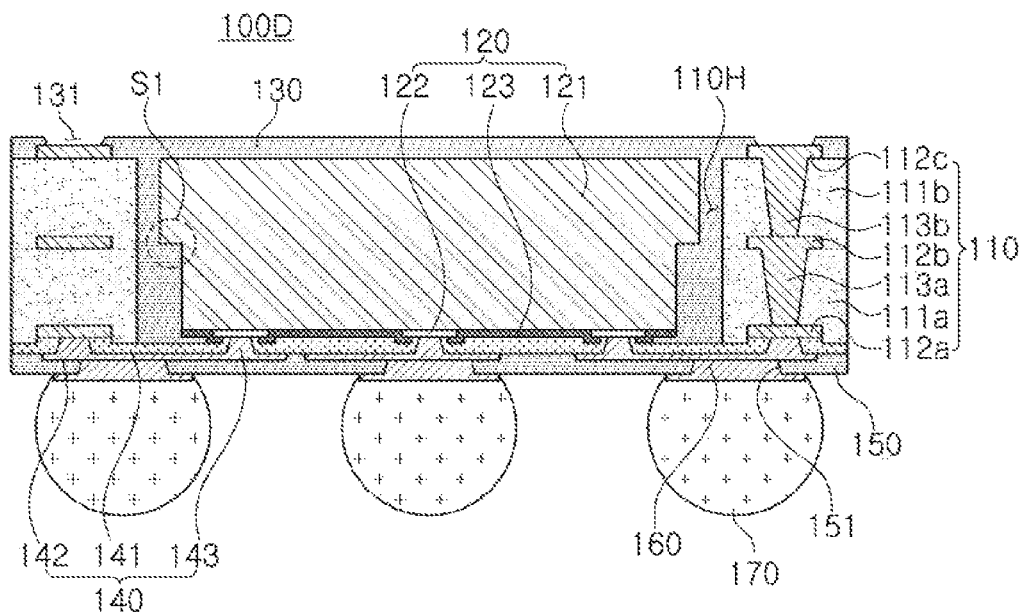
FIG. 14 is a schematic cross-sectional view illustrating another modified example of the fan-out semiconductor package of FIG. 9.

FIG. 14 is a schematic cross-sectional view illustrating another modified example of the fan-out semiconductor package of FIG. 9.

Referring to the drawing, in a fan-out semiconductor package 100D according to another modified example, a first interconnection member 110 may include a first insulating layer 111a, a first redistribution layer 112a in contact with a second interconnection member 140 and embedded in the first insulating layer 111a, a second redistribution layer 112b disposed on the other surface of the first insulating layer 111a opposing one surface of the first insulating layer 111a in which the first redistribution layer 112a is embedded, a second insulating layer 111b disposed on the first insulating layer 111a and covering the second redistribution layer 112b, and a third redistribution layer 112c disposed on the second insulating layer 111b. The first to third redistribution layers 112a, 112b, and 112c may be electrically connected to connection pads 122. The first and second redistribution layers 112a and 112b and the second and third redistribution layers 112b and 112c may be electrically connected to each other by first and second vias 113a and 113b penetrating through the first and second insulating layers 111a and 111b, respectively. Since the first redistribution layer 112a is embedded in the first insulating layer 111a, an insulating distance of an insulating layer 141 of the second interconnection member 140 may be substantially constant. Since the first interconnection member 110 may include a large number of redistribution layers 112a, 112b, and 112c, the second interconnection member 140 may be further simplified. Therefore, a decrease in a yield depending on a defect occurring in a process of forming the second interconnection member 140 may be improved. The first redistribution layer 112a may be recessed in the first insulating layer 111a, such that a lower surface of the first insulating layer 111a may have a step portion with respect to a lower surface of the first redistribution layer 112a. Resultantly, when an encapsulant 130 is formed, a phenomenon in which a material of the encapsulant 130 bleeds to pollute the first redistribution layer 112a may be prevented.

The redistribution layers 112a, 112b, and 112c may serve to redistribute the connection pads 122 of a semiconductor chip 120, and a material of each of the redistribution layers 112a, 112b, and 112c may be a conductive material such as copper (Cu), aluminum (Al), silver (Ag), tin (Sn), gold (Au), nickel (Ni), lead (Pb), titanium (Ti), or alloys thereof. The redistribution layers 112a, 112b, and 112c may have various functions depending on designs of layers corresponding thereto. For example, the redistribution layers 112a, 112b, and 112c may include a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, the redistribution layers 112a, 112b, and 112c may include a via pad, a connection terminal pad, and the like. A surface treatment layer (not illustrated) may be formed on surfaces of pad patterns, or the like, exposed from the third redistribution layer 112c through openings 131, if necessary. The surface treatment layer (not illustrated) may be formed by, for example, electrolytic gold plating, electroless gold plating, OSP or electroless tin plating, electroless silver plating, electroless nickel plating/substituted gold plating, DIG plating, HASL, or the like.

The vias 113a and 113b may electrically connect the redistribution layers 112a, 112b, and 112c formed on different layers to each other, resulting in an electrical path in the first interconnection member 110. A material of each of the vias 113a and 113b may be a conductive material. Each of the vias 113a and 113b may be entirely filled with the conductive material, or the conductive material may also be formed along a wall of respective via holes. In addition, each of the vias 113a and 113b may have all shapes known in the related art, such as a tapered shape, a cylindrical shape, and the like. Meanwhile, when holes for the vias 113a and 113b are formed, some of the pads of the first redistribution layer 112a and the second redistribution layer 112b may serve as a stopper, and it may be thus advantageous in a process that each of the vias 113a and 113b has the tapered shape of which a width of an upper surface is greater than that of a lower surface. In this case, the vias 113a and 113b may be integrated with portions of the second redistribution layer 112b and the third redistribution layer 112c, respectively.

The lower surface of the first redistribution layer 112a of the first interconnection member 110 may be disposed on a level above a lower surface of the connection pads 122 of the semiconductor chip 120. In addition, a distance between a redistribution layer 142 of the second interconnection member 140 and the first redistribution layer 112a of the first interconnection member 110 may be greater than that between the redistribution layer 142 of the second interconnection member 140 and the connection pads 122 of the semiconductor chip 120. Here, the first redistribution layer 112a may be recessed into the first insulating layer 111a. The second redistribution layer 112b of the first interconnection member 110 may be disposed on a level between an active surface and an inactive surface of the semiconductor chip 120. The first interconnection member 110 may be formed to a thickness corresponding to that of the semiconductor chip 120. Therefore, the second redistribution layer 112b formed in the first interconnection member 110 may be disposed on a level between the active surface and the inactive surface of the semiconductor chip 120.

Thicknesses of the redistribution layers 112a, 112b, and 112c of the first interconnection member 110 may be greater than that of the redistribution layer 142 of the second interconnection member 140. Since the first interconnection member 110 may have a thickness equal to or greater than that of the semiconductor chip 120, the redistribution layers 112a, 112b, and 112c may be formed to be large depending on a scale of the first interconnection member 110. On the other hand, the redistribution layer 142 of the second interconnection member 140 may be formed to be relatively small for thinness.

A description, or the like, of configurations other than the abovementioned configuration and a method for manufacturing the fan-out semiconductor package 100A may overlap the description provided above, and is thus omitted. Meanwhile, the description of the fan-out semiconductor package 100B described above may also be applied to the fan-out semiconductor package 100D.

Figure 15:
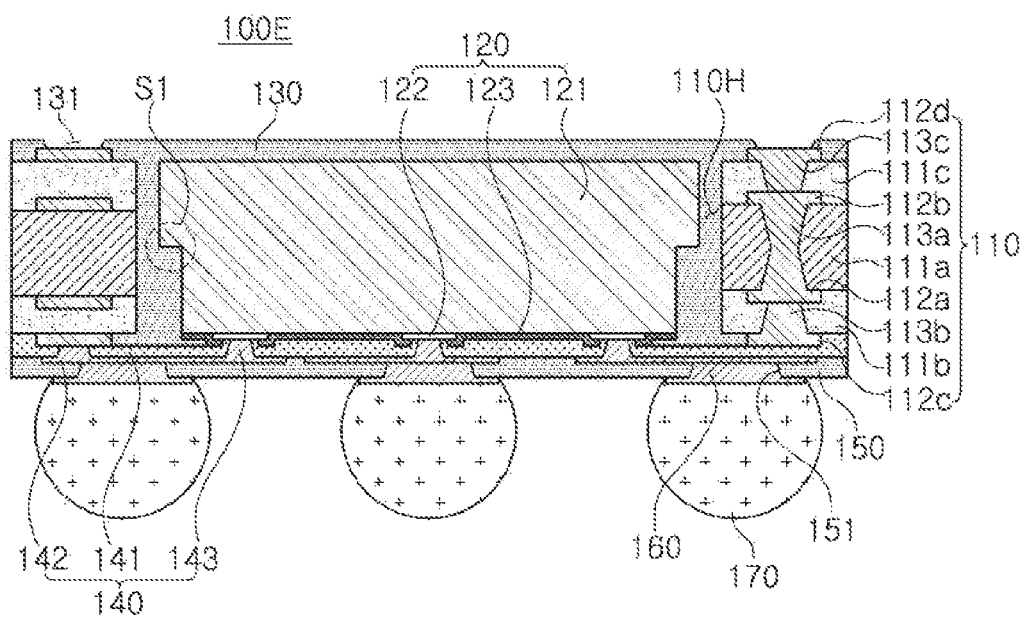
FIG. 15 is a schematic cross-sectional view illustrating another modified example of the fan-out semiconductor package of FIG. 9.

FIG. 15 is a schematic cross-sectional view illustrating another modified example of the fan-out semiconductor package of FIG. 9.

Referring to the drawing, in a fan-out semiconductor package 100E according to another modified example, a first interconnection member 110 may include a first insulating layer 111a, a first redistribution layer 112a and a second redistribution layer 112b disposed on opposite surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c. The first to fourth redistribution layers 112a, 112b, 112c, and 112d may be electrically connected to connection pads 122. Since the first interconnection member 110 may include a larger number of redistribution layers 112a, 112b, 112c, and 112d, a second interconnection member 140 may be further simplified. Therefore, a decrease in a yield depending on a defect occurring in a process of forming the second interconnection member 140 may be improved. The first to fourth redistribution layers 112a, 112b, 112c, and 112d may be electrically connected to each other by first to third vias 113a, 113b, and 113c respectively penetrating through the first to third insulating layers 111a, 111b, and 111c.

The redistribution layers 112a, 112b, 112c, and 112d may serve to redistribute the connection pads 122 of a semiconductor chip 120. A material of each of the redistribution layers 112a, 112b, 112c, and 112d may be a conductive material such as copper (Cu), aluminum (Al), silver (Ag), tin (Sn), gold (Au), nickel (Ni), lead (Pb), titanium (Ti), or alloys thereof. The redistribution layers 112a, 112b, 112c, and 112d may have various functions depending on designs of layers corresponding thereto. For example, the redistribution layers 112a, 112b, 112c, and 112d may include a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, the redistribution layers 112a, 112b, 112c, and 112d may include a via pad, a connection terminal pad, and the like. A surface treatment layer (not illustrated) may be formed on surfaces of pad patterns, or the like, exposed from the fourth redistribution layer 112d through openings 131, if necessary. The surface treatment layer (not illustrated) may be formed by, for example, electrolytic gold plating, electroless gold plating, OSP or electroless tin plating, electroless silver plating, electroless nickel plating/ substituted gold plating, DIG plating, HASL, or the like.

The vias 113a, 113b, and 113c may electrically connect the redistribution layers 112a, 112b, 112c, and 112d formed on different layers to each other, resulting in an electrical path in the first interconnection member 110. A material of each of the vias 113a, 113b, and 113c may be a conductive material. Each of the vias 113a, 113b, and 113c may be entirely filled with the conductive material, or the conductive material may also be formed along a wall of respective via holes. The first via 113a may be a through-via having an hourglass shape, a cylindrical shape, or the like, and the second via 113b and the third via 113c may be blind vias having a tapered shape, or the like.

The first insulating layer 111a may have a thickness greater than those of the second insulating layer 111b and the third insulating layer 111c. The first insulating layer 111a may be relatively thick in order to maintain rigidity, and the second insulating layer 111b and the third insulating layer 111c may be introduced in order to form a larger number of redistribution layers 112c and 112d. The first insulating layer 111a may include an insulating material different from those of the second insulating layer 111b and the third insulating layer 111c. For example, the first insulating layer 111a may be, for example, prepreg including a core material, an inorganic filler, and an insulating resin, and the second insulating layer 111b and the third insulating layer 111c may be an ABF or a photosensitive insulating film including an inorganic filler and an insulating resin. However, the materials of the first insulating layer 111a and the second and third insulating layers 111b and 111c are not limited thereto. Meanwhile, the first insulating layer 111a may have a thickness greater than those of the second insulating layer 111b and the third insulating layer 111c, and the first via 113a may have a dimension greater than those of the second via 113b and the third via 113c.

A lower surface of the third redistribution layer 112c of the first interconnection member 110 may be disposed on a level below a lower surface of the connection pads 122 of the semiconductor chip 120. In addition, a distance between a redistribution layer 142 of the second interconnection member 140 and the third redistribution layer 112c of the first interconnection member 110 may be smaller than that between the redistribution layer 142 of the second interconnection member 140 and the connection pads 122 of the semiconductor chip 120. Here, the third redistribution layer 112c may be disposed in a protruding form on the second insulating layer 111b, resulting in contact with the second interconnection member 140. The first redistribution layer 112a and the second redistribution layer 112b of the first interconnection member 110 may be disposed on a level between an active surface and an inactive surface of the semiconductor chip 120. The first interconnection member 110 may be formed to a thickness corresponding to that of the semiconductor chip 120. Therefore, the first redistribution layer 112a and the second redistribution layer 112b formed in the first interconnection member 110 may be disposed on a level between the active surface and the inactive surface of the semiconductor chip 120.

Thicknesses of the redistribution layers 112a, 112b, 112c, and 112d of the first interconnection member 110 may be greater than that of the redistribution layer 142 of the second interconnection member 140. Since the first interconnection member 110 may have a thickness equal to or greater than that of the semiconductor chip 120, the redistribution layers 112a, 112b, 112c, and 112d may also be formed to have large sizes. On the other hand, the redistribution layer 142 of the second interconnection member 140 may be formed to be relatively small for thinness.

A description, or the like, of configurations other than the abovementioned configuration and a method for manufacturing the fan-out semiconductor package 100A may overlap the description provided above, and is thus omitted. Meanwhile, the description of the fan-out semiconductor package 100B described above may also be applied to the fan-out semiconductor package 100E.

Figure 16:
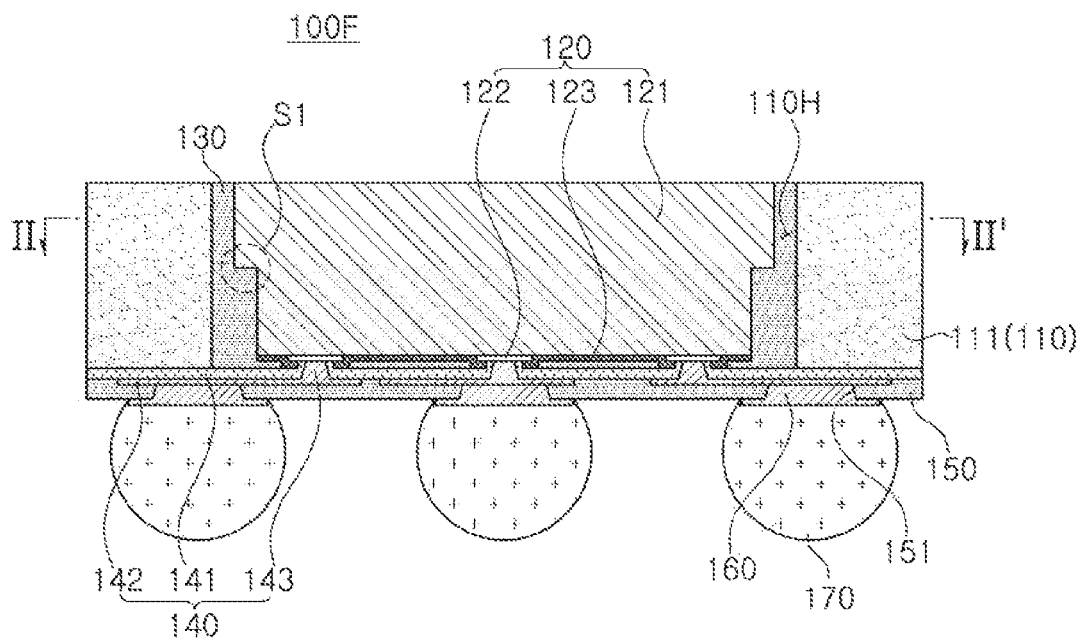
FIG. 16 is a schematic cross-sectional view illustrating another example of a fan-out semiconductor package.

FIG. 16 is a schematic cross-sectional view illustrating another example of a fan-out semiconductor package.

Figure 17:
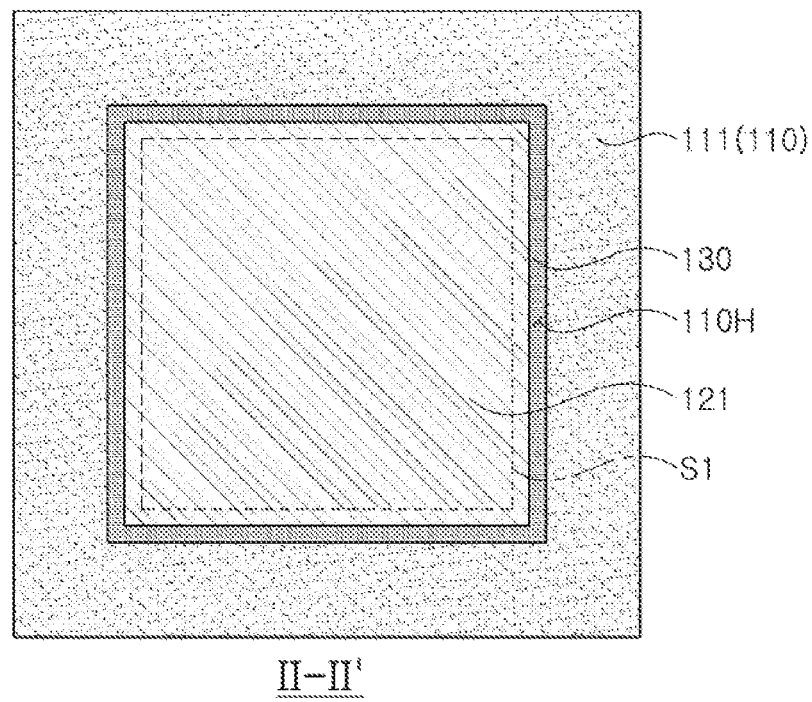
FIG. 17 is a schematic plan view taken along line II-II' of the fan-out semiconductor package of FIG. 16.

FIG. 17 is a schematic plan view taken along line II-II' of the fan-out semiconductor package of FIG. 16.

Referring to the drawings, a fan-out semiconductor package 100F according to another exemplary embodiment in the present disclosure may include a first interconnection member 110 having a through-hole 110H, a semiconductor chip 120 disposed in the through-hole 110H and having an active surface having connection pads 122 disposed thereon and an inactive surface opposing the active surface, an encapsulant 130 filling at least portions of spaces between walls of the through-hole 110H and side surfaces of the semiconductor chip 120, and a second interconnection member 140 disposed on the active surface of the semiconductor chip 120 and including a redistribution layer 142 electrically connected to the connection pads 122 of the semiconductor chip 120 through vias 143. The side surface of the semiconductor chip 120 may have a step portion S1.

An upper surface of the encapsulant 130 may be disposed on a level corresponding to that of an upper surface of the first interconnection member 110 and/or an upper surface of the inactive surface of the semiconductor chip 120. Here, the meaning of "level corresponding to~" includes a case in which levels approximately coincide with each other due to an error in a process as well as a case in which levels entirely coincide with each other. The encapsulant 130 may also fill at least a portion of a space between a passivation layer 123 and the second interconnection member 140 over an entire region of the active surface of the semiconductor chip 120.

A description, or the like, of configurations other than the abovementioned configuration may overlap the description provided above in the fan-out semiconductor package 100A, and is thus omitted.

Figure 18:
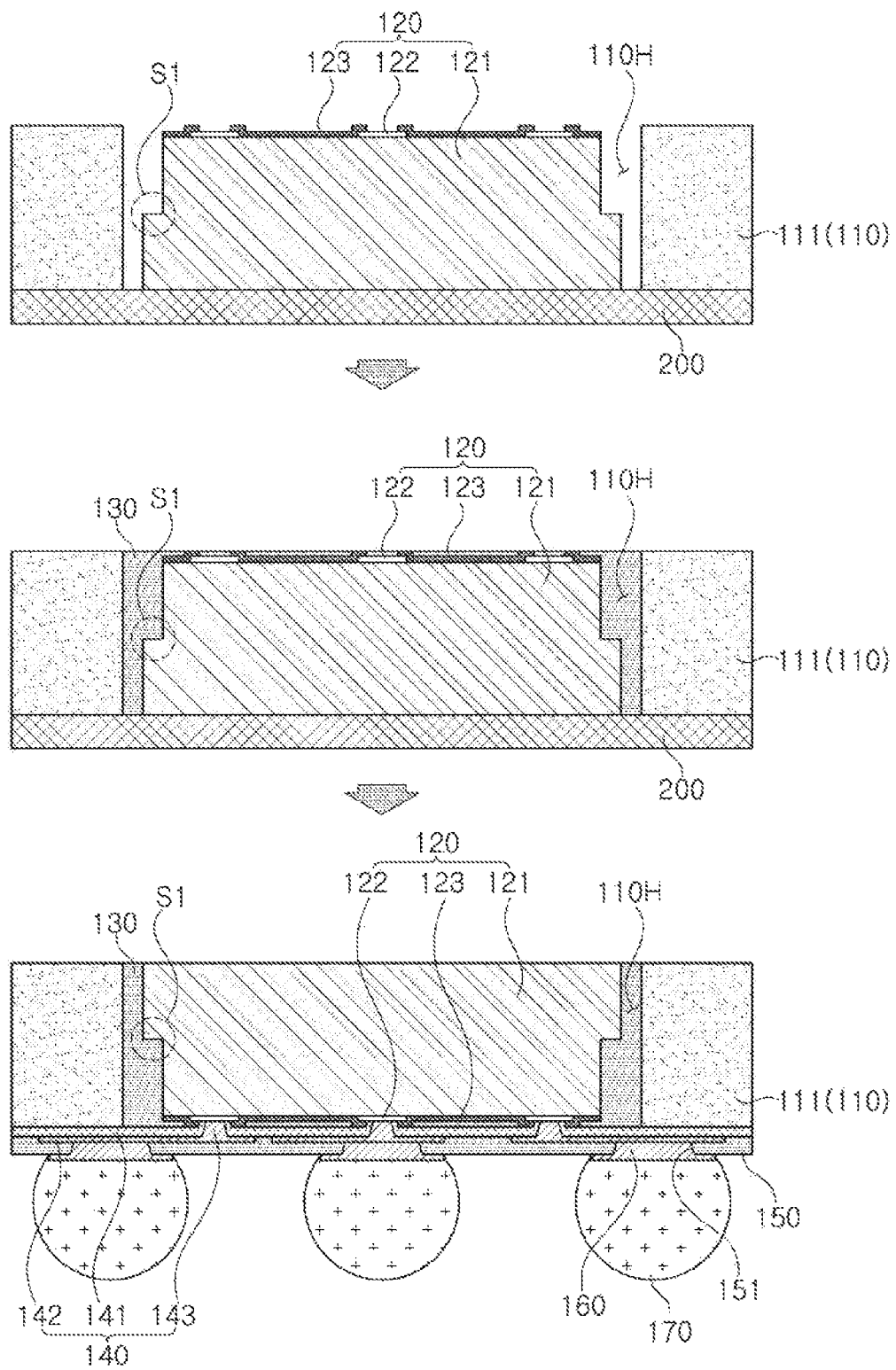
FIG. 18 is schematic views illustrating an example of processes of manufacturing the fan-out semiconductor package of FIG. 16.

FIG. 18 is schematic views illustrating an example of processes of manufacturing the fan-out semiconductor package of FIG. 16.

Referring to the drawing, the first interconnection member 110 may first be prepared. Then, the first interconnection member 110 may be attached to a temporary film 200 such as an adhesive film, or the like. Then, the semiconductor chip 120 may be attached to the temporary film 200 exposed through the through-hole 110H in a face-up form to thus be disposed in the through-hole 110H. Then, at least portions of the semiconductor chip 120 may be encapsulated using the encapsulant 130. The encapsulant 130 may fill at least portions of the spaces between the walls of the through-hole 110H and the side surfaces of the semiconductor chip 120, and may cover at least portions of the passivation layer 123 over the entire region of the active surface of the semiconductor chip 120. Then, the temporary film 200 may be removed. Then, the second interconnection member 140 may be formed in a region opposing a region in which the temporary film 200 is removed. Then, a passivation layer 150, an under-bump metal layer 160, and connection terminals 170 may be sequentially formed on the second interconnection member 140, if necessary.

A description, or the like, of configurations other than the abovementioned configuration may overlap the description provided above in the example of the processes of manufacturing the fan-out semiconductor package 100A, and is thus omitted.

Figure 19:
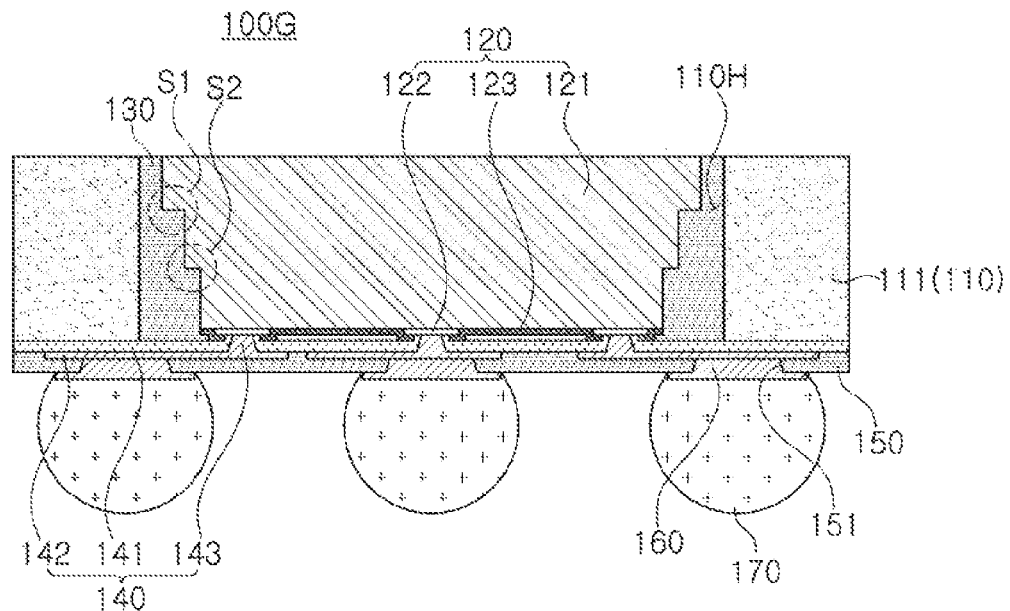
FIG. 19 is a schematic cross-sectional view illustrating a modified example of the fan-out semiconductor package of FIG. 16.

FIG. 19 is a schematic cross-sectional view illustrating a modified example of the fan-out semiconductor package of FIG. 16.

Referring to the drawing, in a fan-out semiconductor package 100G according to the modified example, a plurality of step portions S1 and S2 may be formed between an active surface and an inactive surface of a semiconductor chip 120. That is, the number of step portions S1 and S2 is not necessarily limited to one, but may also be plural. In a case in which the plurality of step portions S1 and S2 are formed, a connection area between an encapsulant 130 and the semiconductor chip 120 may be further increased, such that a reliability improving effect may be more excellent.

A description, or the like, of configurations other than the abovementioned configuration and a method for manufacturing the fan-out semiconductor package 100G may overlap the description provided above in the fan-out semiconductor package 100A and the fan-out semiconductor package 100F, and is thus omitted.

Figure 20:
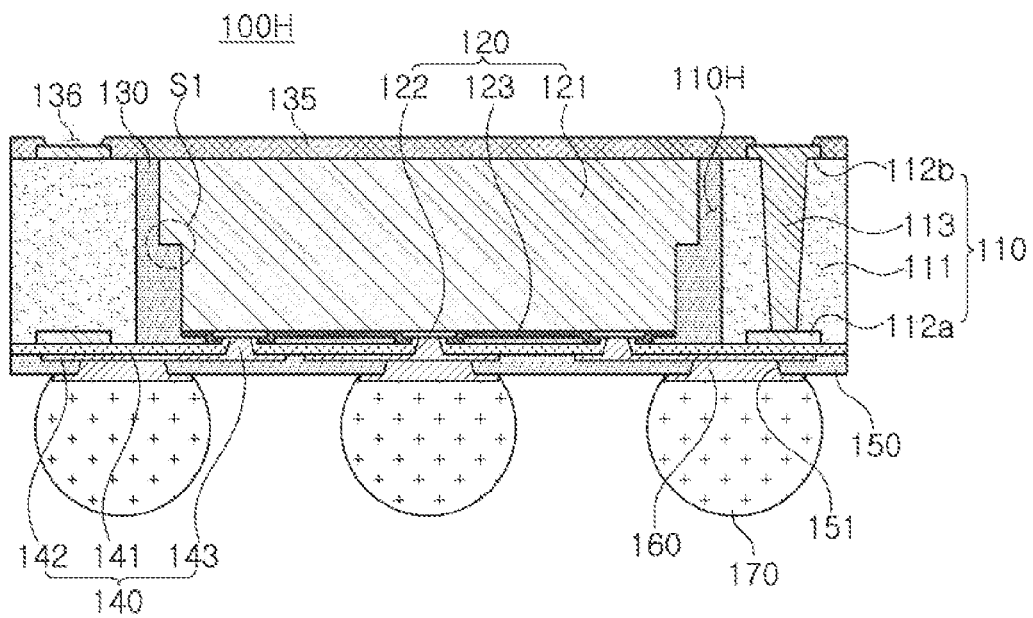
FIG. 20 is a schematic cross-sectional view illustrating another modified example of the fan-out semiconductor package of FIG. 16.

FIG. 20 is a schematic cross-sectional view illustrating another modified example of the fan-out semiconductor package of FIG. 16.

Referring to the drawing, in a fan-out semiconductor package 100H according to another modified example, a first interconnection member 110 may include an insulating layer 111, a first redistribution layer 112a in contact with a second interconnection member 140 and embedded in the insulating layer 111, and a second redistribution layer 112b disposed on the other surface of the insulating layer 111 opposing one surface of the insulating layer 111 in which the first redistribution layer 112a is embedded. The first and second redistribution layers 112a and 112b may be electrically connected to connection pads 122. The first interconnection member 110 may include vias 113 penetrating through the insulating layer 111 and electrically connecting the first and second redistribution layers 112a and 112b to each other. A cover layer 135 having openings 136 exposing at least portions of the second redistribution layer 112b may be disposed on an encapsulant 130. The cover layer 135 may be formed of a material the same as or similar to those of the encapsulant 130 and/or a passivation layer 150.

A description, or the like, of configurations other than the abovementioned configuration and a method for manufacturing the fan-out semiconductor package 100H may overlap the description provided above in the fan-out semiconductor package 100A, the fan-out semiconductor package 100C, and the fan-out semiconductor package 100F, and is thus omitted. Meanwhile, the description of the fan-out semiconductor package 100G described above may also be applied to the fan-out semiconductor package 100H.

Figure 21:
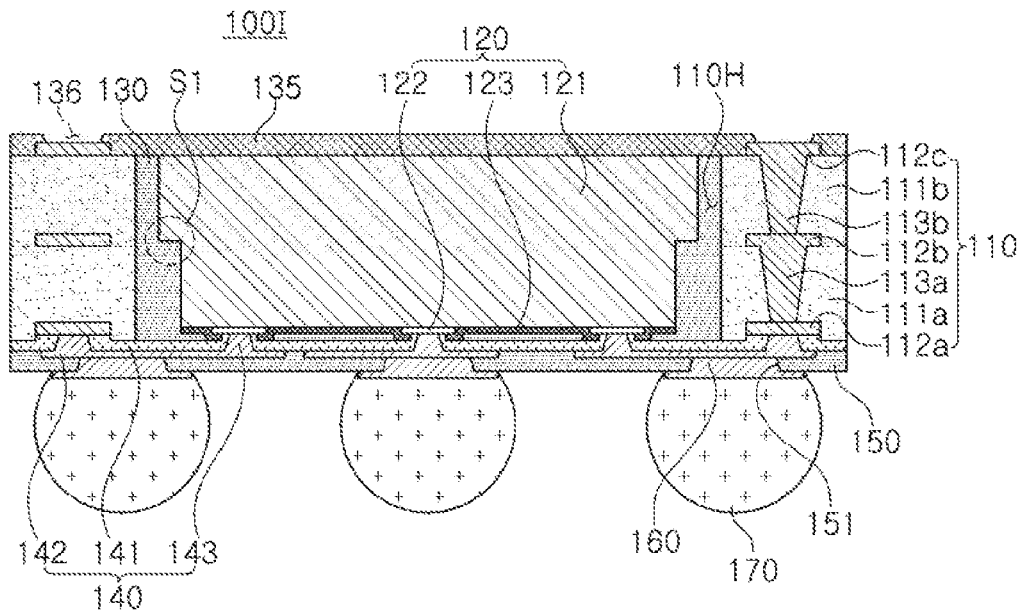
FIG. 21 is a schematic cross-sectional view illustrating another modified example of the fan-out semiconductor package of FIG. 16.

FIG. 21 is a schematic cross-sectional view illustrating another modified example of the fan-out semiconductor package of FIG. 16.

Referring to the drawing, in a fan-out semiconductor package 100I according to another modified example, a first interconnection member 110 may include a first insulating layer 111a, a first redistribution layer 112a in contact with a second interconnection member 140 and embedded in the first insulating layer 111a, a second redistribution layer 112b disposed on the other surface of the first insulating layer 111a opposing one surface of the first insulating layer 111a in which the first redistribution layer 112a is embedded, a second insulating layer 111b disposed on the first insulating layer 111a and covering the second redistribution layer 112b, and a third redistribution layer 112c disposed on the second insulating layer 111b. The first to third redistribution layers 112a, 112b, and 112c may be electrically connected to connection pads 122. The first and second redistribution layers 112a and 112b and the second and third redistribution layers 112b and 112c may be electrically connected to each other by first and second vias 113a and 113b penetrating through the first and second insulating layers 111a and 111b, respectively. A cover layer 135 having openings 136 exposing at least portions of the third redistribution layer 112c may be disposed on an encapsulant 130. The cover layer 135 may be formed of a material the same as or similar to those of the encapsulant 130 and/or a passivation layer 150.

A description, or the like, of configurations other than the abovementioned configuration and a method for manufacturing the fan-out semiconductor package 100I may overlap the description provided above in the fan-out semiconductor package 100A, the fan-out semiconductor package 100D, and the fan-out semiconductor package 100F, and is thus omitted. Meanwhile, the description of the fan-out semiconductor package 100G described above may also be applied to the fan-out semiconductor package 100I.

Figure 22:
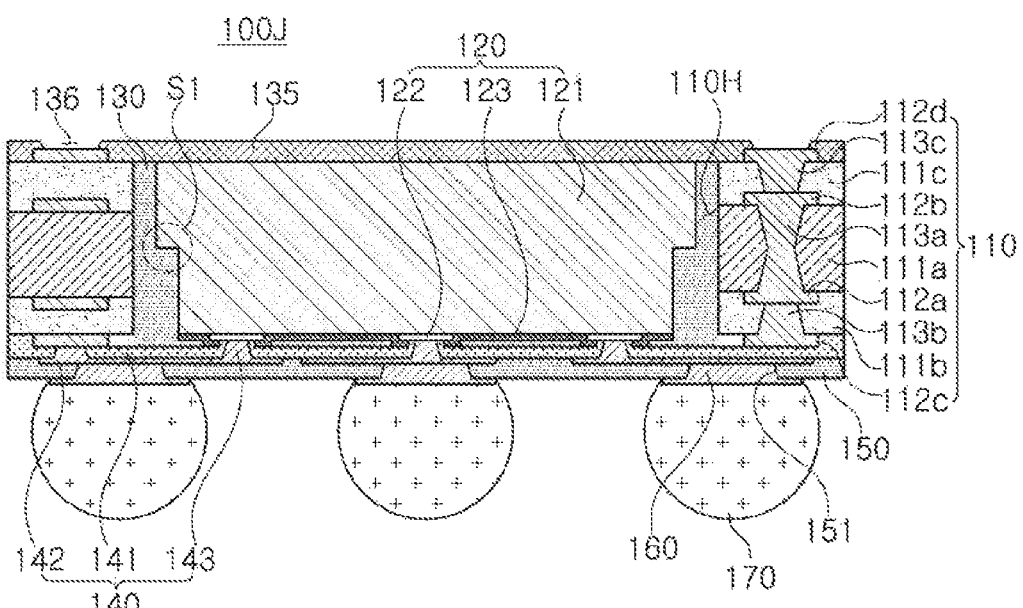
FIG. 22 is a schematic cross-sectional view illustrating another modified example of the fan-out semiconductor package of FIG. 16.

FIG. 22 is a schematic cross-sectional view illustrating another modified example of the fan-out semiconductor package of FIG. 16.

Referring to the drawing, in a fan-out semiconductor package 100J according to another modified example, a first interconnection member 110 may include a first insulating layer 111a, a first redistribution layer 112a and a second redistribution layer 112b disposed on opposite surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c. The first to fourth redistribution layers 112a, 112b, 112c, and 112d may be electrically connected to the connection pads 122. The first to fourth redistribution layers 112a, 112b, 112c, and 112d may be electrically connected to each other by first to third vias 113a, 113b, and 113c each penetrating through the first to third insulating layers 111a, 111b, and 111c. A cover layer 135 having openings 136 exposing at least portions of the fourth redistribution layer 112d may be disposed on an encapsulant 130. The cover layer 135 may be formed of a material the same as or similar to those of the encapsulant 130 and/or a passivation layer 150.

A description, or the like, of configurations other than the abovementioned configuration and a method for manufacturing the fan-out semiconductor package 100J may overlap the description provided above in the fan-out semiconductor package 100A, the fan-out semiconductor package 100E, and the fan-out semiconductor package 100F, and is thus omitted. Meanwhile, the description of the fan-out semiconductor package 100G described above may also be applied to the fan-out semiconductor package 100J.

As set forth above, according to the exemplary embodiment in the present disclosure, a fan-out semiconductor package in which close adhesion between a semiconductor chip and an encapsulant encapsulating the semiconductor chip may be improved may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
a first interconnection member having a through-hole;
a semiconductor chip disposed in the through-hole and having an active surface having connection pads disposed thereon and an inactive surface opposing the active surface;
an encapsulant filling at least portions of spaces between walls of the through-hole and side surfaces of the semiconductor chip; and
a second interconnection member disposed on the active surface of the semiconductor chip and including a redistribution layer electrically connected to the connection pads of the semiconductor chip through vias,
wherein the side surface of the semiconductor chip has a step portion, and
the side surface of the semiconductor chip has a staircase-shaped cross section by the step portion.

2. The fan-out semiconductor package of claim 1, wherein the step portion is formed so that a width of the active surface is smaller than that of the inactive surface.

3. The fan-out semiconductor package of claim 1, wherein the encapsulant encapsulates at least portions of the first interconnection member and inactive surface of the semiconductor chip.

4. The fan-out semiconductor package of claim 1, wherein the first interconnection member includes a first insulating layer, a first redistribution layer in contact with the second interconnection member and embedded in the first insulating layer, and a second redistribution layer disposed on the other surface of the first insulating layer opposing one surface of the first insulating layer in which the first redistribution layer is embedded, and the first and second redistribution layers are electrically connected to the connection pads.

5. The fan-out semiconductor package of claim 4, wherein the first interconnection member further includes a second insulating layer disposed on the first insulating layer and covering the second redistribution layer and a third redistribution layer disposed on the second insulating layer, and the third redistribution layer is electrically connected to the connection pads.

6. The fan-out semiconductor package of claim 4, wherein a distance between the redistribution layer of the second interconnection member and the first redistribution layer is greater than that between the redistribution layer of the second interconnection member and the connection pad.

7. The fan-out semiconductor package of claim 4, wherein the first redistribution layer has a thickness greater than that of the redistribution layer of the second interconnection member.

8. The fan-out semiconductor package of claim 5, wherein the second redistribution layer is disposed on a level between the active surface and the inactive surface of the semiconductor chip.

9. The fan-out semiconductor package of claim 1, wherein the first interconnection member includes a first insulating layer, a first redistribution layer and a second redistribution layer disposed on opposite surfaces of the first insulating layer, respectively, a second insulating layer disposed on the first insulating layer and covering the first redistribution layer, and a third redistribution layer disposed on the second insulating layer, and the first to third redistribution layers are electrically connected to the connection pads.

10. The fan-out semiconductor package of claim 9, wherein the first interconnection member further includes a third insulating layer disposed on the first insulating layer and covering the second redistribution layer and a fourth redistribution layer disposed on the third insulating layer, and the fourth redistribution layer is electrically connected to the connection pads.

11. The fan-out semiconductor package of claim 9, wherein the first insulating layer has a thickness greater than that of the second insulating layer.

12. The fan-out semiconductor package of claim 9, wherein the third redistribution layer has a thickness greater than that of the redistribution layer of the second interconnection member.

13. The fan-out semiconductor package of claim 9, wherein the first redistribution layer is disposed on a level between the active surface and the inactive surface of the semiconductor chip.

14. A fan-out semiconductor package, comprising:
a first interconnection member having a through-hole;
a semiconductor chip disposed in the through-hole and having an active surface having connection pads disposed thereon and an inactive surface opposing the active surface;

an encapsulant filling at least portions of spaces between walls of the through-hole and side surfaces of the semiconductor chip; and a second interconnection member disposed on the active surface of the semiconductor chip and including a redistribution layer electrically connected to the connection pads of the semiconductor chip through vias, wherein the side surface of the semiconductor chip, connecting the active surface and the inactive surface, has two or more step portions.

15. The fan-out semiconductor package of claim 14, wherein the encapsulant encapsulates at least portions of the first interconnection member and inactive surface of the semiconductor chip.

16. The fan-out semiconductor package of claim 14, wherein the first interconnection member includes a first insulating layer, a first redistribution layer in contact with the second interconnection member and embedded in the first insulating layer, and a second redistribution layer disposed on the other surface of the first insulating layer opposing one surface of the first insulating layer in which the first redistribution layer is embedded, and the first and second redistribution layers are electrically connected to the connection pads.

17. A fan-out semiconductor package comprising:
a first interconnection member having a through-hole;
a semiconductor chip disposed in the through-hole, and having an active surface having connection pads disposed thereon, an inactive surface opposing the active surface, and a side surface connecting the active surface and the inactive surface;

an encapsulant filling at least portions of spaces between walls of the through-hole and side surfaces of the semiconductor chip; and a second interconnection member disposed on the active surface of the semiconductor chip and including a redistribution layer electrically connected to the connection pads of the semiconductor chip through vias, wherein at least a portion of the semiconductor chip has a width in a direction parallel to the active surface different from a width of another portion of the semiconductor chip in the direction parallel to the active surface, and the first interconnection member includes a first insulating layer, a first redistribution layer in contact with the second interconnection member and embedded in the first insulating layer, and a second redistribution layer disposed on the other surface of the first insulating layer opposing one surface of the first insulating layer in which the first redistribution layer is embedded, the first and second redistribution layers are electrically connected to the connection pads, the first interconnection member further includes a second insulating layer disposed on the first insulating layer and covering the second redistribution layer and a third redistribution layer disposed on the second insulating layer, and the third redistribution layer is electrically connected to the connection pads.

18. The fan-out semiconductor package of claim 17, wherein a width of the active surface of the semiconductor chip is smaller than that of the inactive surface thereof.

19. The fan-out semiconductor package of claim 17, wherein the second redistribution layer is disposed on a level between the active surface and the inactive surface of the semiconductor chip.

20. The fan-out semiconductor package of claim 16, wherein the first interconnection member further includes a second insulating layer disposed on the first insulating layer and covering the second redistribution layer and a third redistribution layer disposed on the second insulating layer, and the third redistribution layer is electrically connected to the connection pads.

\* \* \* \* \*